(12) United States Patent
Higashikawa et al.

(10) Patent No.: US 11,049,981 B2
(45) Date of Patent: Jun. 29, 2021

(54) PHOTOVOLTAIC DEVICE AND SOLAR CELL STRING INCLUDING PHOTOVOLTAIC DEVICES

(71) Applicant: SHARP KABUSHIKI KAISHA, Sakai (JP)

(72) Inventors: Makoto Higashikawa, Sakai (JP); Teruaki Higo, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/191,205

(22) Filed: Nov. 14, 2018

(65) Prior Publication Data

US 2019/0148565 A1    May 16, 2019

(30) Foreign Application Priority Data

Nov. 14, 2017 (JP) .............................. JP2017-219149

(51) Int. Cl.

| H01L 31/02 | (2006.01) |
|---|---|
| H01L 31/05 | (2014.01) |
| H01L 31/068 | (2012.01) |
| H01L 31/0224 | (2006.01) |
| H01L 31/0475 | (2014.01) |
| H01L 31/0236 | (2006.01) |
| H01L 31/0216 | (2014.01) |
| H01L 31/0747 | (2012.01) |

(52) U.S. Cl.
CPC .. *H01L 31/02013* (2013.01); *H01L 31/02167* (2013.01); *H01L 31/02168* (2013.01); *H01L 31/02363* (2013.01); *H01L 31/022441* (2013.01); *H01L 31/0475* (2014.12); *H01L 31/0516* (2013.01); *H01L 31/0682* (2013.01); *H01L 31/0747* (2013.01)

(58) Field of Classification Search
CPC ....... H01L 31/02013; H01L 31/022441; H01L 31/022458; H01L 31/0516; H01L 31/0682
See application file for complete search history.

(56) References Cited

U.S. PATENT DOCUMENTS

2011/0120530 A1    5/2011    Isaka

FOREIGN PATENT DOCUMENTS

WO    2009/025147 A1    2/2009

*Primary Examiner* — Niki Bakhtiari
(74) *Attorney, Agent, or Firm* — ScienBiziP, P.C.

(57) ABSTRACT

A photovoltaic device (10) includes: a p-type diffusion region (11) and an n-type diffusion region (12) on the backside of a semiconductor substrate (1); electrodes (4, 5); and a wiring board (8). The electrodes (4) are disposed on the p-type diffusion region (11), and the electrodes (5) are disposed on the n-type diffusion region (12). The wiring board (8) includes a wire group (82) connected to the electrodes (4, 6) by conductive adhesion layers (7) and a wire group (83) connected to the electrodes (5) by conductive adhesion layers (7). The photovoltaic device (10) includes at least one of a first structure in which a plurality of electrodes (50) includes at least a pair of adjacent electrodes connected to a single wire and a second structure in which a plurality of electrodes (40) includes at least a pair of adjacent electrodes connected to a single wire.

4 Claims, 26 Drawing Sheets

(a)

(b)

(c)

(d)

(e)

(f)

(g)

(h)

(i)

(f)

(g)

(h)

(i)

PHOTOVOLTAIC DEVICE AND SOLAR CELL STRING INCLUDING PHOTOVOLTAIC DEVICES

FIELD OF THE INVENTION

The present invention relates to photovoltaic devices and solar cell strings including photovoltaic devices.

BACKGROUND OF THE INVENTION

PCT International Application Publication No. WO2009/025147 discloses a back-contacted solar cell ("photovoltaic device"). This photovoltaic device includes first-conductivity-type regions, second-conductivity-type regions, first electrodes for use with first-conductivity components, second electrodes for use with second-conductivity components, first non-connecting regions, and second non-connecting regions.

A first-conductivity-type region and a second-conductivity-type region are provided alternately on one of the surfaces of a semiconductor substrate. The first electrodes are located in the first-conductivity-type regions, and the second electrodes are located in the second-conductivity-type regions. A first non-connecting region, obstructing electrical connection to a first electrode, is located between every two second electrodes that are adjacent in an aligning direction along which the first-conductivity-type regions and the second-conductivity-type regions are aligned. A second non-connecting region, obstructing electrical connection to a second electrode, is located between every two first electrodes that are adjacent in that aligning direction.

SUMMARY OF THE INVENTION

PCT International Application Publication No. WO2009/025147, in FIG. 3, discloses a structure including a plurality of electrodes in a direction indicated by arrow 201. FIG. 3 shows a structure in which each wire 131 is connected to a different electrode in the direction indicated by arrow 201. FIG. 4 shows a string structure in which: there is arranged a plurality of electrodes along the direction indicated by arrow 201; and each wire is connected to a different electrode in the direction indicated by arrow 201. These structures may exhibit poor performance due to differences in characteristics between electrodes that are adjacent in the direction indicated by arrow 201. In addition, if some contacts are defective, the structure exhibits poor performance.

Accordingly, the present invention, in an embodiment thereof, provides a photovoltaic device including a plurality of electrode groups with wire contacts that exhibit good characteristics.

The present invention, in another embodiment thereof, provides a solar cell string including photovoltaic devices each including a plurality of electrode groups with wire contacts that exhibit good characteristics.

Structure 1

The present invention, in an embodiment thereof, is directed to a photovoltaic device including: a semiconductor substrate; a first semiconductor layer; a second semiconductor layer, a plurality of first electrodes; a plurality of second electrodes; a first wire group; a second wire group; a first non-connecting region; and a second non-connecting region. The semiconductor substrate is of a first conductivity type. The first semiconductor layer is of the first conductivity type and includes regions on one of faces of the semiconductor substrate, the regions being spaced apart from each other in a first direction. The second semiconductor layer is of a second conductivity type that is opposite the first conductivity type and includes regions on that face of the semiconductor substrate, the regions being disposed alternately with the first semiconductor layer along the first direction. The first electrodes are disposed on the first semiconductor layer and spaced apart from each other in the first direction, and have a second direction that is orthogonal to the first direction as a lengthwise direction thereof. The second electrodes are disposed on the second semiconductor layer and spaced apart from each other in the first direction, and have the second direction as a lengthwise direction thereof. The first wire group is arranged along the second direction and electrically connected to the first electrodes in the first direction. The second wire group is arranged along the second direction and electrically connected to the second electrodes in the first direction. The first non-connecting region is located between those second electrodes which are adjacent in the first direction and obstructs electrical connection between the first electrodes and the second wire group. The second non-connecting region is located between those first electrodes which are adjacent in the first direction and obstructs electrical connection between the second electrodes and the first wire group. The first electrodes include a first electrode group arranged along the second direction. The second electrodes include a second electrode group arranged along the second direction. The photovoltaic device further includes at least one of a first structure in which the first electrode group includes at least one pair of adjacent electrodes connected to a single wire in the first wire group and a second structure in which the second electrode group includes at least one pair of adjacent electrodes connected to a single wire in the second wire group.

Structure 2

The photovoltaic device of structure 1 may further include at least one of a third structure in which the first electrode group includes at least one electrode connected to a plurality of wires in the first wire group and a fourth structure in which the second electrode group includes at least one electrode connected to a plurality of wires in the second wire group.

Structure 3

The photovoltaic device of structure 1 or 2 may be configured such that gaps between electrodes in the first electrode group are provided at different locations than are gaps between electrodes in the second electrode group.

Structure 4

The photovoltaic device of any one of structures 1 to 3 may be configured so as to further include at least one of a fifth structure in which the at least one pair of adjacent electrodes in the first electrode group is connected to a single wire in the first wire group by conductive adhesive near ends thereof and a sixth structure in which the at least one pair of adjacent electrodes in the second electrode group is connected to a single wire in the second wire group by the conductive adhesive near ends thereof.

Structure 5

The photovoltaic device of any one of structures 1 to 3 may be configured so as to further include at least one of a seventh structure in which the at least one pair of adjacent electrodes in the first electrode group is connected to a single wire in the first wire group by conductive adhesive near ends thereof and an eighth structure in which the at least one pair of adjacent electrodes in the second electrode group is connected to a single wire in the second wire group by the conductive adhesive near ends thereof, wherein the conductive adhesive bridges either the at least one pair of adjacent electrodes in the first electrode group or the at least one pair of adjacent electrodes in the second electrode group and is connected to that pair of adjacent electrodes.

Structure 6

The present invention, in an embodiment thereof, is directed to a solar cell string including a first photovoltaic device and a second photovoltaic device. Each of the first and second photovoltaic devices includes the photovoltaic device of any one of structures 1 to 5. The first wire group is spaced apart and connected to the second photovoltaic device. The second wire group is spaced apart and connected to the first photovoltaic device.

Structure 7

The present invention, in an embodiment thereof, is directed to another solar cell string including a first photovoltaic device and a second photovoltaic device. Each of the first and second photovoltaic devices includes the photovoltaic device of any one of structures 1 to 5. The first wire group includes mutually connected parts and is connected to the second photovoltaic device. The second wire group includes mutually connected parts and is connected to the first photovoltaic device.

DESCRIPTION OF EMBODIMENTS

Figure 1A:
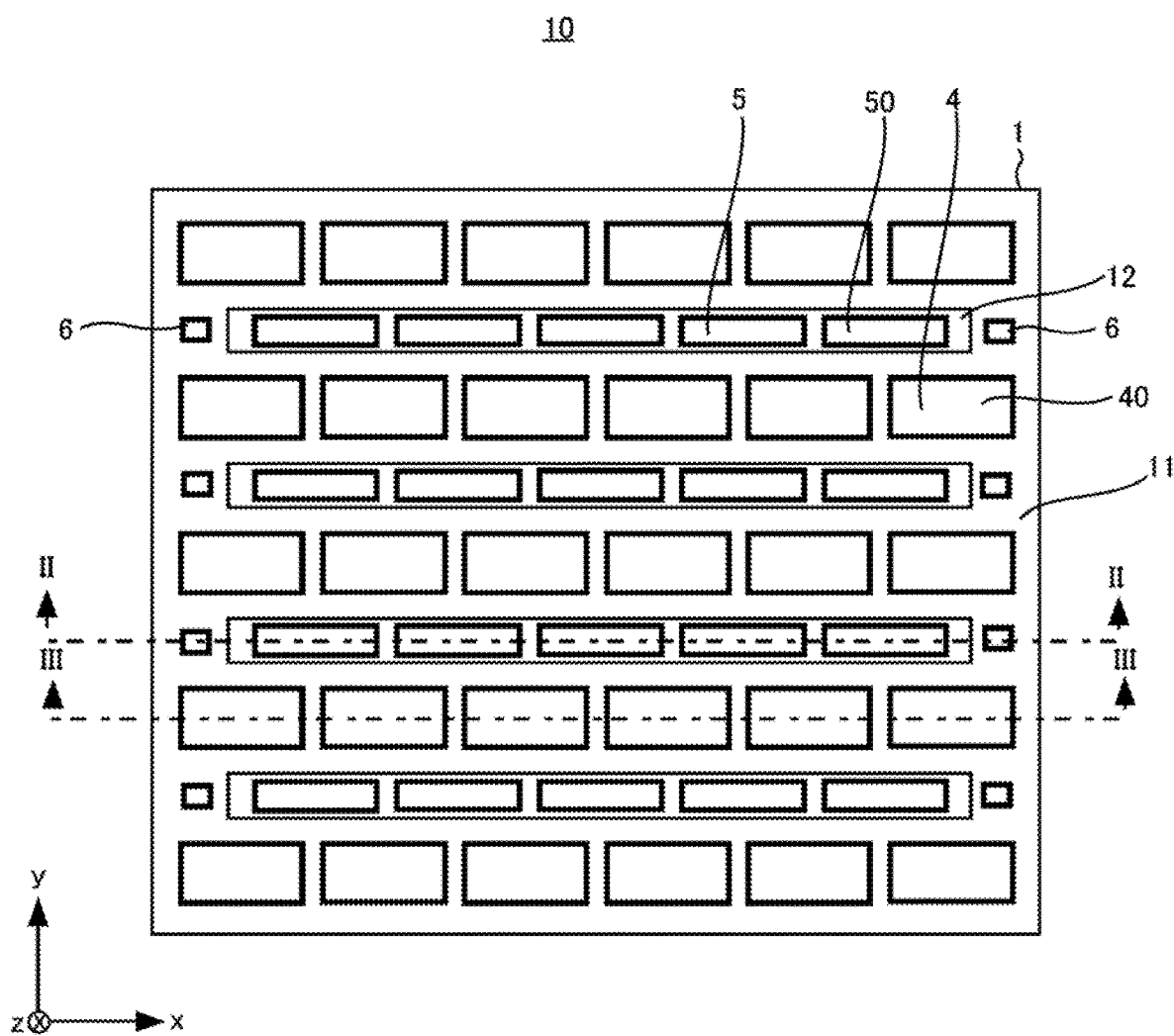
FIG. 1A is a first plan view of a photovoltaic device in accordance with Embodiment 1.

The following will describe embodiments of the present invention in detail in reference to drawings. Identical or equivalent members will be denoted by the same reference signs in the drawings, and description thereof is not repeated.

Embodiment 1

Figure 1B:
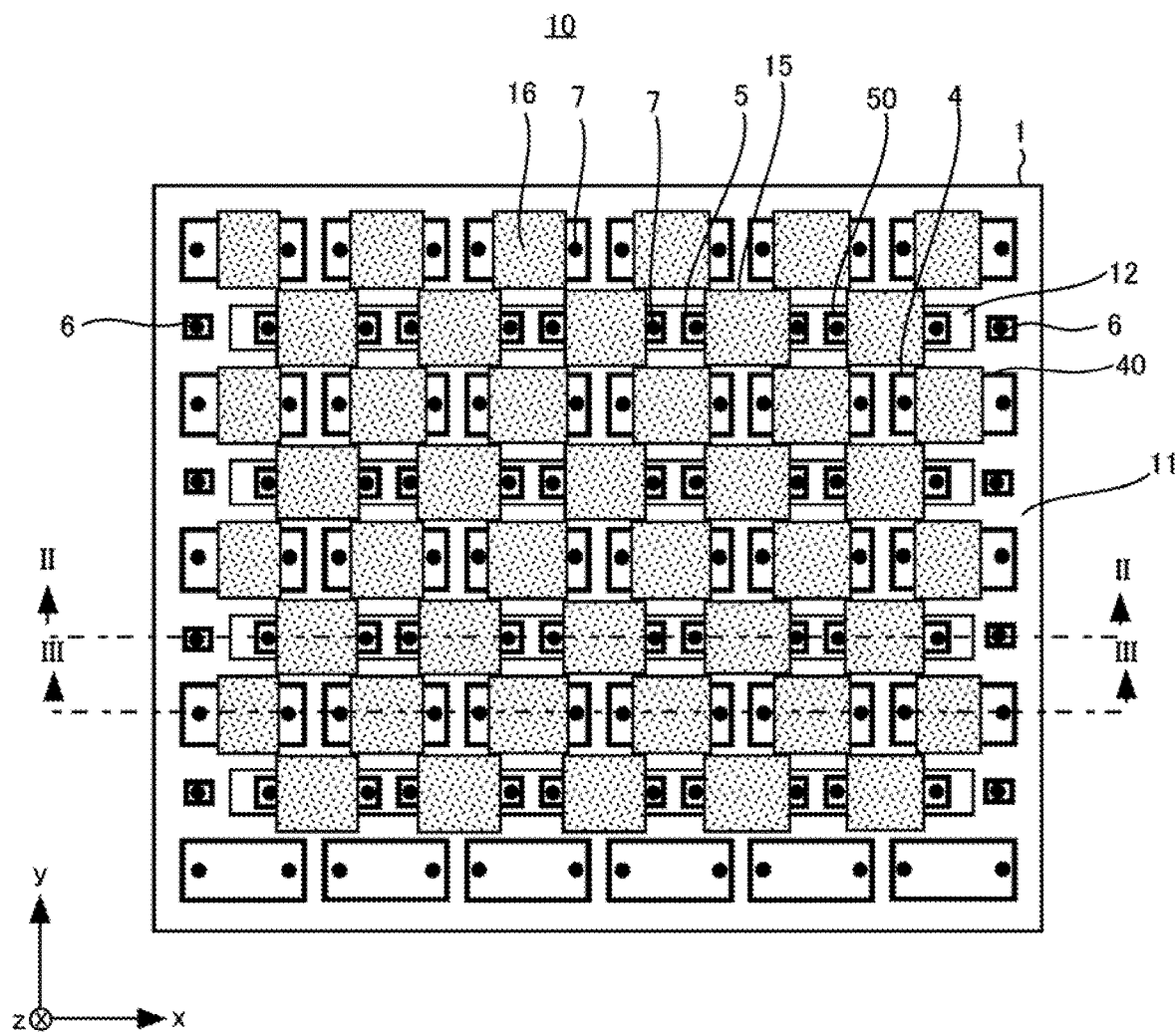
FIG. 1B is a second plan view of the photovoltaic device in accordance with Embodiment 1.
Figure 1C:
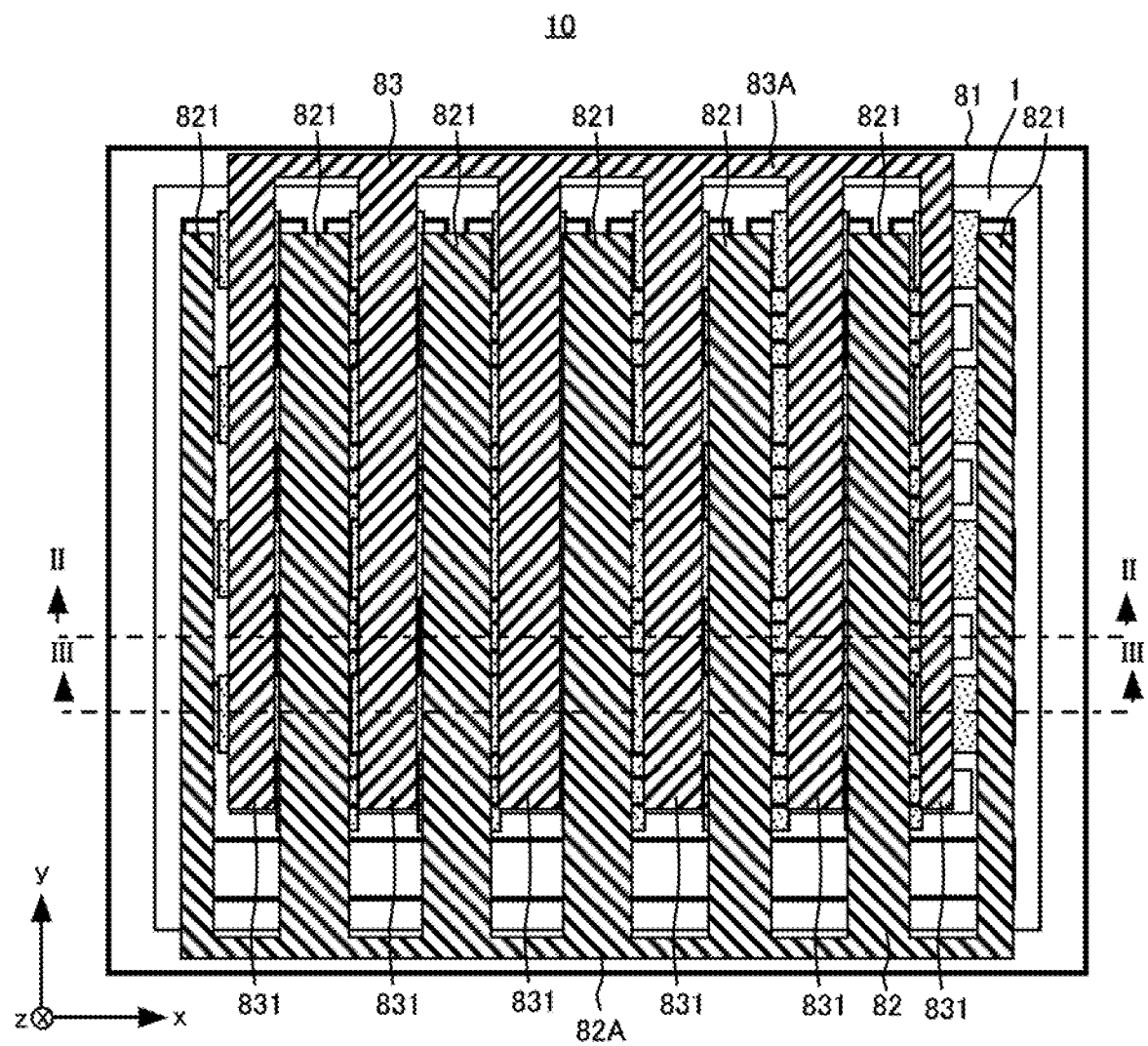
FIG. 1C is a third plan view of the photovoltaic device in accordance with Embodiment 1.
Figure 2:
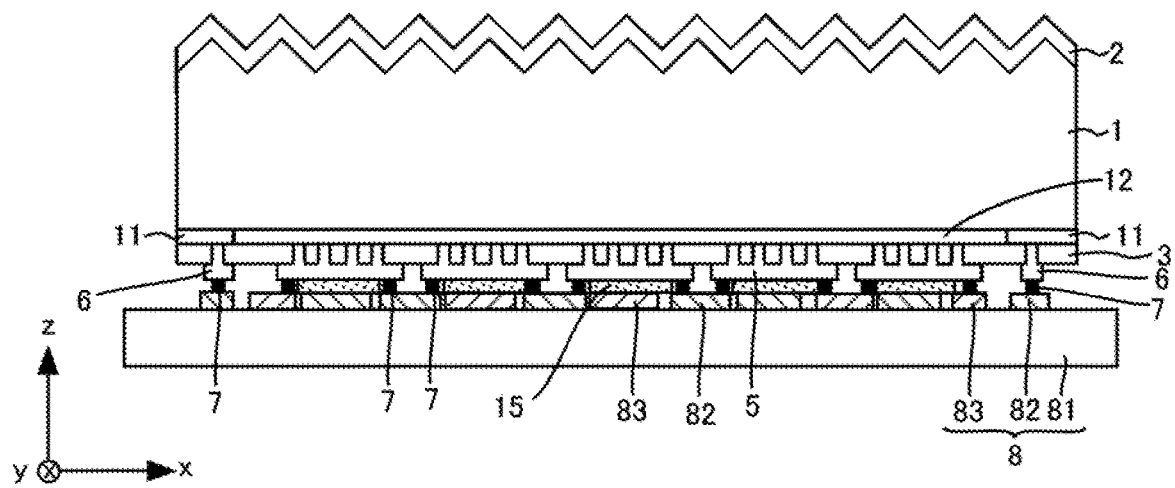
FIG. 2 is a cross-sectional view of the photovoltaic device, taken along line II-II in FIGS. 1A to 1C.
Figure 3:
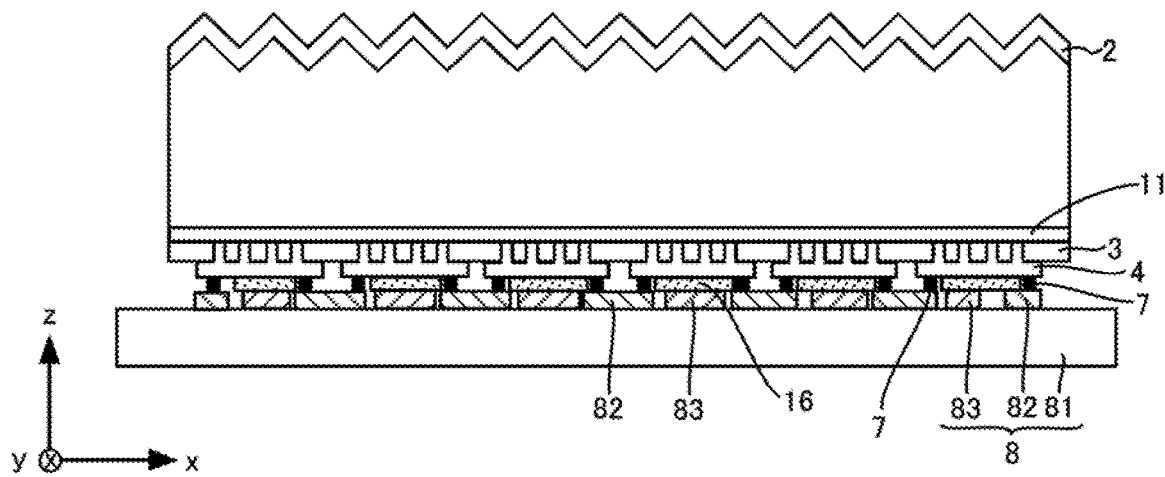
FIG. 3 is a cross-sectional view of the photovoltaic device, taken along line III-III in FIGS. 1A to 1C.

FIGS. 1A to 1C are first to third plan views, respectively, of a photovoltaic device in accordance with Embodiment 1. FIG. 2 is a cross-sectional view of the photovoltaic device, taken along line II-II in FIGS. 1A to 1C. FIG. 3 is a cross-sectional view of the photovoltaic device, taken along line III-III in FIGS. 1A to 1C. FIG. 1A shows, in plan view, a p-type diffusion layer, n-type diffusion layers, and electrodes of the photovoltaic device as viewed from the side that is opposite a light-incident side thereof. FIG. 1B shows, in plan view, conductive adhesion layers and non-connecting regions of the photovoltaic device as viewed from the side that is opposite the light-incident side. FIG. 1C shows, in plan view, wires and an insulating substrate of the photovoltaic device as viewed from the side that is opposite the light-incident side. FIG. 1C depicts the insulating substrate as being transparent, so that the wires are visible. An x-axis, a y-axis, and a z-axis are defined as indicated in FIGS. 1A to 1C, 2, and 3.

Referring to FIGS. 1A to 1C, 2, and 3, a photovoltaic device 10 in accordance with Embodiment 1 includes a semiconductor substrate 1, an antireflective film 2, a passivation film 3, electrodes 4 to 6, conductive adhesion layers 7, a wiring board 8, and non-connecting regions 15 and 16.

The semiconductor substrate 1 is built around, for example, an n-type monocrystalline silicon substrate and has a thickness of 100 to 200 Lm. The semiconductor substrate 1 has, for example, a crystal orientation in the (100) direction and a specific resistance of 1 to 10 Ωcm. The semiconductor substrate 1 has texture on a light-incident-side surface thereof.

The semiconductor substrate 1 includes a p-type diffusion layer 11 and n-type diffusion layers 12 on a surface that is opposite the light-incident-side surface where texture is formed. The p-type diffusion layer 11 is arranged so as to surround the n-type diffusion layers 12 in the x-y plane.

The semiconductor substrate 1 includes a plurality of regions spaced apart from each other in the y-axis direction on the surface that is opposite the light-incident-side surface, each region including a p-type diffusion layer. The semiconductor substrate 1 further includes a plurality of regions arranged alternately with the p-type diffusion layers 11 along the y-axis direction on the surface that is opposite the light-incident-side surface, each region including an n-type diffusion layer.

The p-type diffusion layer 11 extends in the x-axis direction beyond the ends of the n-type diffusion layers 12 and toward the edges of the semiconductor substrate 1.

The p-type diffusion layer 11 contains, for example, boron (B) as a p-type impurity. The boron concentration is, for example, from $1 \times 10^{19}$ cm$^{-3}$ to $1 \times 10^{20}$ cm$^{-3}$. The p-type diffusion layer 11 has a depth of, for example, 0.1 μm to 0.5 μm.

The n-type diffusion layers 12 contain, for example, phosphorus (P) as an n-type impurity. The phosphorus concentration is, for example, from $1 \times 10^{19}$ cm$^{-3}$ to $1 \times 10^2$ cm$^{-3}$. The n-type diffusion layers 12 have a depth of, for example, 0.1 μm to 0.5 μm.

The antireflective film 2 is disposed on the light-incident-side surface of the semiconductor substrate 1. The antireflective film 2 includes, for example, a stack of silicon oxide and silicon nitride. In this example, the silicon oxide is in contact with the semiconductor substrate 1, and the silicon nitride is in contact with the silicon oxide. The antireflective film 2 has a thickness of, for example, 100 to 1000 nm.

The passivation film 3 is disposed on the surface that is opposite the light-incident-side surface of the semiconductor substrate 1. The passivation film 3 lies on the p-type diffusion layer 11 and the n-type diffusion layers 12 and in contact with the p-type diffusion layer 11 and the n-type diffusion layers 12.

The passivation film 3 is composed of, for example, silicon oxide, silicon nitride, and alumina. The passivation film 3 has a thickness of, for example, 50 nm to 100 nm.

The electrodes 4 are disposed in contact with the p-type diffusion layer via a plurality of openings formed in the passivation film 3. The electrodes 4 include a plurality of electrodes 40 on the p-type diffusion layers 11. The electrodes 40 are spaced apart from each other in the y-axis direction and spaced apart from each other by prescribed distances in the x-axis direction (see FIGS. 1A and 3).

Where the diffusion layers are formed in this manner, these mutually separated electrodes occupy smaller areas. That reduces the light lost by absorption at the interface between the electrodes and the passivation film and thereby provides improved characteristics, which is preferable.

The electrodes 4 extend in the x-axis direction beyond the ends of the electrodes 5 toward the edges of the semiconductor substrate 1. The electrodes 4 preferably extend to or within 1 mm from the edges of the semiconductor substrate 1.

The electrodes 5 are disposed in contact with the n-type diffusion layers 12 via a plurality of openings formed in the passivation film 3. The electrodes 5 include a plurality of electrodes 50 disposed on the n-type diffusion layers 12. The electrodes 50 are spaced apart from each other in the y-axis direction and spaced apart from each other by prescribed distances in the x-axis direction (see FIGS. 1A and 2).

The gaps separating adjacent electrodes 40 in the x-axis direction are provided at different locations than the gaps separating adjacent electrodes 50 in the x-axis direction (see FIG. 1A). This structure where the electrodes 40 and 40 are separated at different locations than the electrodes 50 and 50 makes it possible to provide contacts to wire groups at different locations. That in turn facilitates the formation of wire contacts, which is preferable.

The electrodes 6 are disposed, on both ends of each n-type diffusion layer 12 with respect to the x-axis direction, on an x-axis wise extension of the n-type diffusion layer 12 between those electrodes 4 which are adjacent in the y-axis direction (see FIGS. 1A and 2). The electrodes 6 are in contact with the p-type diffusion layer 11 and the passivation film 3 via openings formed in the passivation film 3. The electrodes 6 preferably have ends thereof at or within 1 mm from the edges of the semiconductor substrate 1.

The electrodes 4 to 6 are composed of, for example, silver and have respective thicknesses ranging from 100 to 3000 nm. The electrodes 6 have a width that is smaller than that of the electrodes 5.

The conductive adhesion layers 7 are disposed at the ends of the electrodes 4 and 5 with respect to the x-axis direction in contact with the electrodes 4 and 5 and also on the electrodes 6 in contact with the electrodes 6 (see FIG. 1B). The conductive adhesion layers 7 on the electrodes 4 and 6 are electrically connected to wires 821 that constitute a wire group 82 for the wiring board 8. The conductive adhesion layers 7 on the electrodes 5 are electrically connected to wires 831 that constitute a wire group 83 for the wiring board (see FIGS. 1B, 2, and 3). The conductive adhesion layers 7 are composed of, for example, a low-melting-point solder, a conductive adhesive, and/or a conductive paste.

The wiring board 8 includes an insulating substrate 81 and the wire groups 82 and 83. The wire group 82 includes segments 82A parts of which are connected to each other. The wire group 83 includes segments 83A parts of which are connected to each other. The wire groups 82 and 83 are disposed on the insulating substrate 81. The wire groups 82 and 83 are shaped like a comb in a plan view (see FIG. 1C). The wire group 82 extends along the y-axis direction and is connected electrically to the electrodes 4 and 6 by the conductive adhesion layers 7. Meanwhile, the wire group 83 extends along the y-axis direction and is connected electrically to the electrodes 5 by the conductive adhesion layers 7.

To electrically connect the wire group 82 to the electrodes 4 via the conductive adhesion layers 7, the electrodes 4 are connected, for example, at two sites thereof (e.g., those two electrodes 40 and 40 which are adjacent in the x-axis direction) by the conductive adhesion layers 7 to the wires 821 that constitute the wire group 82 (see FIGS. 1B and 1C). To electrically connect the wire group 83 to the electrodes 5 via the conductive adhesion layers 7, the electrodes 5 are connected, for example, at two sites thereof (e.g., those two electrodes 50 and 50 which are adjacent in the x-axis direction) by the conductive adhesion layers 7 to the wires 831 that constitute the wire group 83 (see FIGS. 1B and 1C). In this structure, the electric charge collected via an electrode 40 in a pair of adjacent electrodes 40 and 40 is substantially equal to the electric charge collected via the other electrode 40, which translates into smaller differences in characteristics between that pair of adjacent electrodes 40 and 40. The same description applies to a pair of adjacent electrodes 50 and 50. As a result, the structure provides wire contacts with good characteristics.

A pair of electrodes 40 and 40 that are adjacent in the x-axis direction is connected to the same one of the wires 821 by those conductive adhesion layers 7 which are disposed near the ends of that pair of adjacent electrodes 40 and 40. A pair of electrodes 50 and 50 that are adjacent in the x-axis direction is connected to the same one of the wires 831 by those conductive adhesion layers 7 which are disposed near the ends of that pair of adjacent electrodes 50 and 50. This structure in which the electrodes 40 and 50 are connected near the ends thereof is preferable because the structure can efficiently collect to the wires the current collected by the electrodes 4, 5, and 6 and can facilitate the formation of contacts between the wires 821 and the pair of adjacent electrodes 40 and 40 and contacts between the wires 831 and the pair of adjacent electrodes 50 and 50.

One of the electrodes 40 included in the electrodes 4 is connected to the wires 821 that constitute the wire group 82. One of the electrodes 50 included in the electrodes 5 is connected to the wires 831 that constitute the wire group 83. This structure, in the event of a broken wire or improper connection between an electrode and a wire, still maintains a connection between that electrode and the other wire. The structure can therefore minimize deterioration of characteristics, which is preferable.

The insulating substrate 81 is composed of an insulating material such as a film of polyester, polyethylene naphthalate, or polyimide.

The wire groups 82 and 83 are composed of a conductive material such as a stack of aluminum, copper, silver, tin, and zinc.

The non-connecting regions 15 are provided between the electrodes 5 and the wire group 82 between those electrodes 4 which are adjacent in the y-axis direction (see FIGS. 1B and 2). The non-connecting regions 15 obstruct electrical connection of the wire group 82 to the electrodes 5 between those electrodes 4 which are adjacent in the y-axis direction. The non-connecting regions 15 preferably include an insulating layer formed on parts of the surfaces of the electrodes 5. In this preferable structure, the insulating layer is composed of an insulating resin or an inorganic material such as silicon nitride.

The non-connecting regions 16 are provided between the electrodes 4 and the wire group 83 between those electrodes 5 which are adjacent in the y-axis direction (see FIGS. 1B and 3). The non-connecting regions 16 obstruct electrical connection of the wire group 83 to the electrodes 4 between those electrodes 5 which are adjacent in the y-axis direction. The non-connecting regions 16 preferably include an insulating layer formed on parts of the surfaces of the electrodes 4. In this preferable structure, the insulating layer is composed of an insulating resin or an inorganic material such as silicon nitride.

As described above, the electrodes 4 and 6 are electrically connected to the wire group 82 on the wiring board 8 by the conductive adhesion layers 7. The electrodes 5 are electrically connected to the wire group 83 on the wiring board 8 by the conductive adhesion layers 7. The electrical connection between the electrodes 4 and 6 and the wire group 82 and the electrical connection between the electrodes 5 and the wire group 83 may be made by compression or any other method that can make electrical connection.

FIG. 1A shows a plurality of electrodes 4, electrodes 5, and n-type diffusion layers 12 arranged along the y-axis direction. Their numbers are not limited to any particular value.

FIG. 1A shows a plurality of electrodes 6 arranged along the y-axis direction. There needs to be provided at least one electrode 6 along the y-axis direction. Their number is not limited to any particular value.

FIG. 1C shows a plurality of wire groups 82 and a plurality of wire groups 83 arranged along the x-axis direction. Their numbers are not limited to any particular value.

The photovoltaic device 10 may not include the electrodes 6.

Figure 4:
FIG. 4 is a first manufacturing step diagram illustrating manufacturing steps of the photovoltaic device shown in FIGS. 1A to 1C, 2, and 3.
Figure 4:
Figure 4:
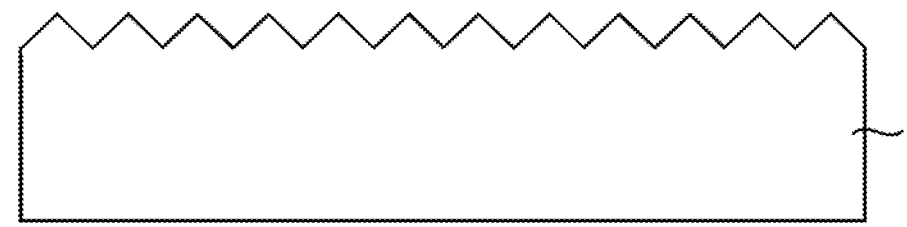
Figure 4:
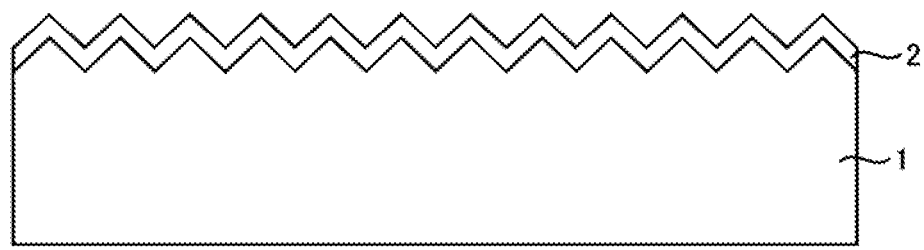
Figure 4:
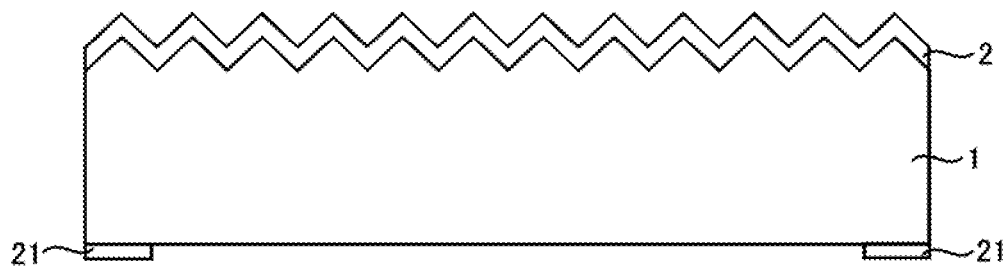
Figure 5:
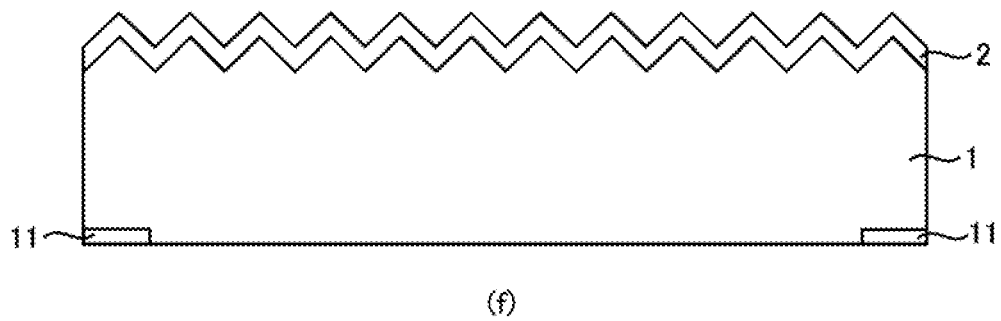
FIG. 5 is a second manufacturing step diagram illustrating manufacturing steps of the photovoltaic device shown in FIGS. 1A to 1C, 2, and 3.
Figure 5:
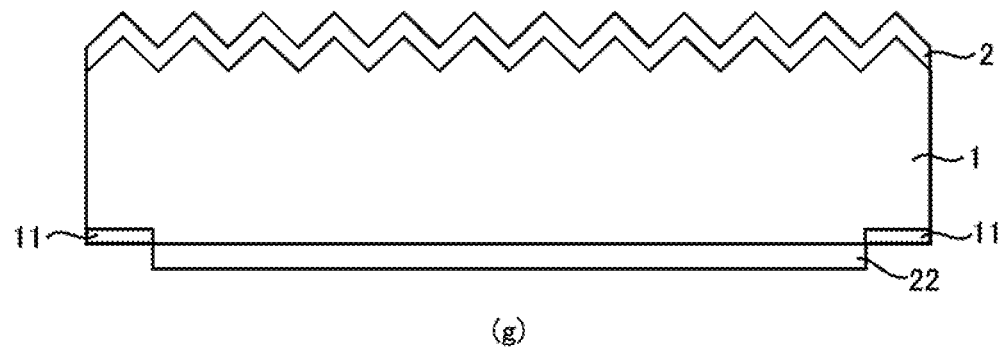
Figure 5:
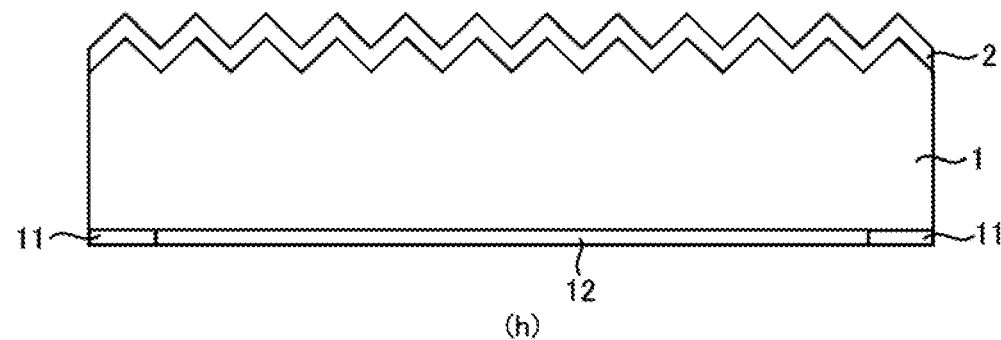
Figure 5:
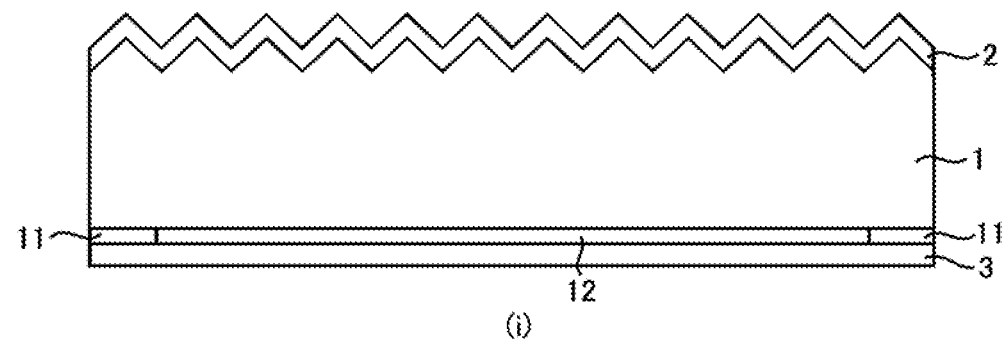
Figure 6:
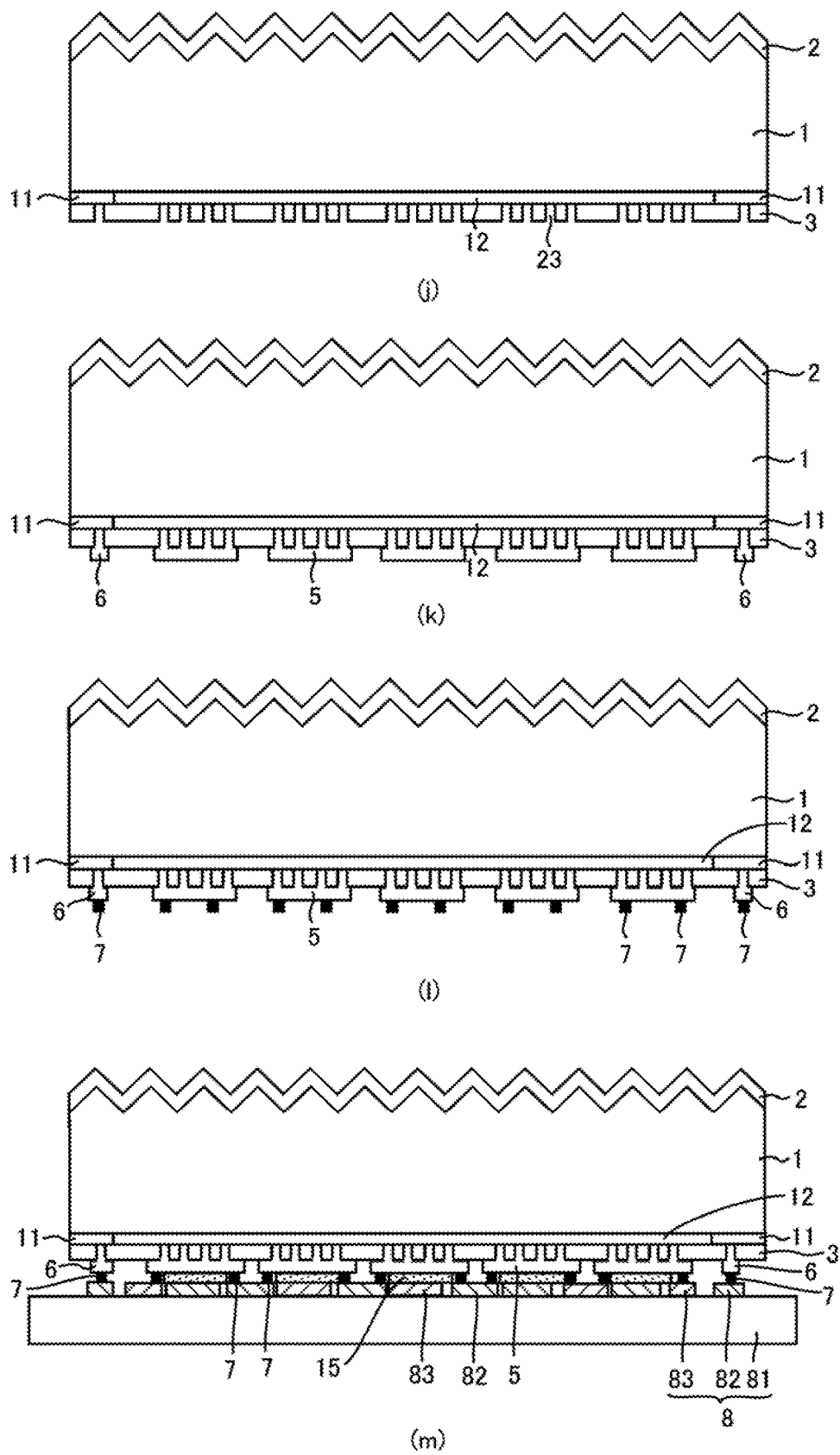
FIG. 6 is a third manufacturing step diagram illustrating manufacturing steps of the photovoltaic device shown in FIGS. 1A to 1C, 2, and 3.

FIGS. 4 to 6 are respectively first to third manufacturing step diagrams illustrating manufacturing steps of the photovoltaic device 10 shown in FIGS. 1A to 1C, 2, and 3. The manufacturing step diagrams in FIGS. 4 to 6 are prepared based on cross-sectional views taken along line II-II in FIGS. 1A to 1C.

Now referring to FIG. 4, a semiconductor substrate 1' is prepared at the start of the manufacture of the photovoltaic device 10 (step (a) in FIG. 4). The semiconductor substrate 1' has the same crystal orientation, specific resistance, conductivity type, and thickness as the semiconductor substrate 1.

A protective film 20 is then formed on one of faces of the semiconductor substrate 1' (step (b) in FIG. 4). The protective film 20 is composed of, for example, silicon oxide and silicon nitride and formed by, for example, sputtering.

Thereafter, the semiconductor substrate 1' on which the protective film 20 has been formed is etched in an alkaline solution of, for example, NaOH or KOH (e.g., an aqueous solution of KOH (1 to 5 wt %) and isopropyl alcohol (1 to 10 wt %)). This technique anisotropically etches a surface of the semiconductor substrate 1' that is opposite the face thereof carrying the protective film 20 thereon, thereby forming a pyramidal texture on that surface. The protective film 20 is then removed to obtain the semiconductor substrate 1 (see step (c) in FIG. 4).

Subsequently, the antireflective film 2 is formed on the surface of the semiconductor substrate 1 on which the texture has been formed (step (d) in FIG. 4). More specifically, the antireflective film 2 is formed, for example, by sequentially depositing silicon oxide and silicon nitride on the semiconductor substrate 1 by sputtering.

Following step (d), a BSG (boron silicate glass) film 21 is formed on parts of the surface (backside) of the semiconductor substrate 1 that is opposite the surface thereof carrying the texture (step (e) in FIG. 4). The BSG film 21 has a thickness of, for example, 300 to 1000 nm.

The BSG film 21 is thereafter processed with heat at 850 to 900° C. in order to diffuse boron (B) from the BSG film 21 to the semiconductor substrate 1. The remaining BSG film 21 is then removed in an aqueous solution of hydrogen fluoride, which forms the p-type diffusion layer 11 on the backside of the semiconductor substrate 1 (step (f) in FIG. 5).

Subsequently, a PSG (phosphorus silicate glass) film 22 is formed on parts of the backside of the semiconductor substrate 1 (step (g) in FIG. 5). The PSG film 22 has a thickness of, for example, 300 to 1000 nm.

The PSG film 22 is thereafter processed with heat at 850 to 900° C. in order to diffuse phosphorus (P) from the PSG film 22 to the semiconductor substrate 1. The remaining PSG film 22 is then removed in an aqueous solution of hydrogen fluoride, which forms the n-type diffusion layers 12 on the backside of the semiconductor substrate 1 (step (h) in FIG. 5).

The passivation film 3 is then formed on the p-type diffusion layer 11 and the n-type diffusion layers 12 (step (i) in FIG. 5). More specifically, the passivation film 3 is formed on the p-type diffusion layer 11 and the n-type diffusion layers 12, for example, by providing silicon oxide by sputtering.

Next, resist is applied onto the passivation film 3 and patterned by photolithography. The passivation film 3 is then etched using the patterned resist as a mask in order to form openings 23 in the passivation film 3 (step (j) in FIG. 6).

Thereafter, a metal (e.g., silver) is provided across the entire surface of the passivation film 3, which has the openings 23 therein, by, for example, vapor deposition. The provided metal (e.g., silver) is patterned by photolithography using resist in order to form the electrodes 5 and 6 (step (k) in FIG. 6). The electrodes 4 (not shown in step (k) in FIG. 6) are formed simultaneously with the electrodes 5 and 6.

Following step (k), a low-melting-point solder paste is provided in the form of dots on the electrodes 5 and 6 by printing or a like technique in order to form some of the conductive adhesion layers 7 (step (1) in FIG. 6). The low-melting-point solder paste is provided in the form of dots also on the electrodes 4 in order to form the rest of the conductive adhesion layers 7.

Next, the insulating substrate 81 is prepared, which is approximately 150 μm thick. The semiconductor substrate 1 and the wiring board 8 are attached together with their positions adjusted in such a manner that the wire groups 82 and 83 become substantially orthogonal to the electrodes 4 and 6 and the electrodes 5 respectively in order to establish electrical contacts in prescribed locations. Then, for example, pressure and heat are applied to the combined semiconductor substrate 1 and wiring board 8 from both sides thereof to electrically join them, which completes the manufacture of the photovoltaic device 10 (step (m) in FIG. 6).

The wiring board 8 is formed by providing a metal such as copper across the entire surface of the insulating substrate 81 and etching out or otherwise removing parts of the provided metal (i.e., patterning).

The photovoltaic device 10 includes the p-type diffusion layer 11 surrounding the n-type diffusion layers 12 on one of the surfaces of the semiconductor substrate 1. The p-type diffusion layer 11 includes a plurality of p-type diffusion layers arranged spaced apart from each other along the y-axis direction.

The photovoltaic device 10 further includes the electrodes 40 and 50. The electrodes 40, disposed on the p-type diffusion layer 11, run along the x-axis direction, which is the lengthwise direction of the electrodes 40. The electrodes 50, disposed on the n-type diffusion layers 12, run along the x-axis direction, which is the lengthwise directions of the electrodes 50.

The photovoltaic device 10 further includes the electrodes 6 disposed between the ends of the n-type diffusion layers 12 with respect to the x-axis direction and the edges of the semiconductor substrate 1 with respect to the x-axis direction.

The photovoltaic device 10 further includes the non-connecting regions 15 and 16. The non-connecting regions 15, disposed between those electrodes 4 which are adjacent in the y-axis direction, obstruct electrical connection to the electrodes 5. The non-connecting regions 16, disposed between those electrodes 5 which are adjacent in the y-axis direction, obstruct electrical connection to the electrodes 4.

The wiring board 8 includes the wire groups 82 and 83 arranged along the y-axis direction. The wire group 82 is electrically connected to the electrodes 4 and 6. The wire group 83 is electrically connected to the electrodes 5.

A pair of adjacent electrodes 40 and 40 is connected to the same one of the wires 821. A pair of adjacent electrodes 50 and 50 is connected to the same one of the wires 831.

Therefore, the electric charge collected via an electrode 40 in a pair of adjacent electrodes 40 and 40 is substantially equal to the electric charge collected via the other electrode 40, which translates into smaller differences in characteristics between that pair of adjacent electrodes 40 and 40. The same description applies to a pair of adjacent electrodes 50 and 50. As a result, this structure provides wire contacts with good characteristics.

The electrodes 4 do not constitute a continuous body surrounding the electrodes 5. The electrodes 4 include the electrodes 40 arranged along the x-axis direction. This structure is less likely to suffer from adverse effects of broken wires and other defects that may occur in patterning. The electrodes 40 have a simple shape, which facilitates the fabrication of the patterning mask.

The electrodes 4 extend toward the edges of the semiconductor substrate 1, thereby enabling collection of carriers generated near the edges. This structure is less likely to suffer from adverse effects of shape variations near the edges of the semiconductor substrate than a structure where the electrodes 4 constitute a continuous body surrounding the electrodes 5 near the edges of the semiconductor substrate. The structure therefore facilitates the design of the patterning mask and aligning in the patterning process, which reduces patterning defects.

If there are provided electrodes 6 between those electrodes 4 which are adjacent in the y-axis direction, the carriers generated in these regions can also be collected. The provision of independent electrodes 6 further increases shape stability in patterning and also increases ease of alignment. Carriers can be well collected in the presence of small variations in the shape of the electrodes 6.

If the electrodes and wires are provided parallel, it is relatively difficult to connect the electrodes 6 to the wire group 82 without touching the electrodes 5. However, the electrodes 6 can be connected to the wire group 82 by providing the wires 821 extending along the y-axis direction and providing independent electrodes 6 between the electrodes 4. In this structure, the electrodes 6 can be well connected to the wire group 82, especially at the edges of the semiconductor substrate 1. The structure therefore achieves stable characteristics of the photovoltaic device 10 and an improved yield of the photovoltaic device 10. In addition, when the photovoltaic device 10 is used over an extended period of time, the structure alleviates deterioration of characteristics, thereby improving reliability.

The semiconductor substrate 1 has been described so far as being built around an n-type monocrystalline silicon substrate. Alternatively, in Embodiment 1, the semiconductor substrate 1 may be built around any of an n-type polycrystalline silicon substrate, a p-type monocrystalline silicon substrate, and a p-type polycrystalline silicon substrate.

If the semiconductor substrate 1 is built around a p-type monocrystalline silicon substrate or a p-type polycrystalline silicon substrate, the p-type diffusion layer 11 and the n-type diffusion layers 12 simply need to be exchanged in the description above.

Each pair of adjacent electrodes 40 and 40 in the electrodes 4 has been described as being connected to a different one of the wires 821 as a preferred example. Each pair of adjacent electrodes 50 and 50 in the electrodes 5 has been described as being connected to a one different one of the wires 831 as a preferred example. Alternatively, in Embodiment 1, the photovoltaic device 10 may have either at least one of structure 1 where at least a pair of adjacent electrodes 40 and 40 included in the electrodes 4 is connected to one of the wires 821 and structure 2 where at least a pair of adjacent electrodes 50 and 50 included in the electrodes 5 is connected to one of the wires 831. Both of these structures can alleviate differences in characteristics between adjacent electrodes, thereby providing wire contacts that exhibit better characteristics than other structures.

The electrodes 6 have been described as being disposed between the edges of the semiconductor substrate 1 and the n-type diffusion layers 12 on both ends of each n-type diffusion layer 12 with respect to the x-axis direction. Alternatively, in Embodiment 1, the electrodes 6 may be disposed between the edges of the semiconductor substrate 1 and at least one of the ends of each n-type diffusion layer 12 with respect to the x-axis direction.

The p-type diffusion layer 11 in the photovoltaic device 10 may include a plurality of p-type diffusion layers arranged spaced apart from each other along the x-axis direction. The n-type diffusion layers 12 in the photovoltaic device 10 may include a plurality of n-type diffusion layers arranged spaced apart from each other along the x-axis direction.

Embodiment 2

Figure 7A:
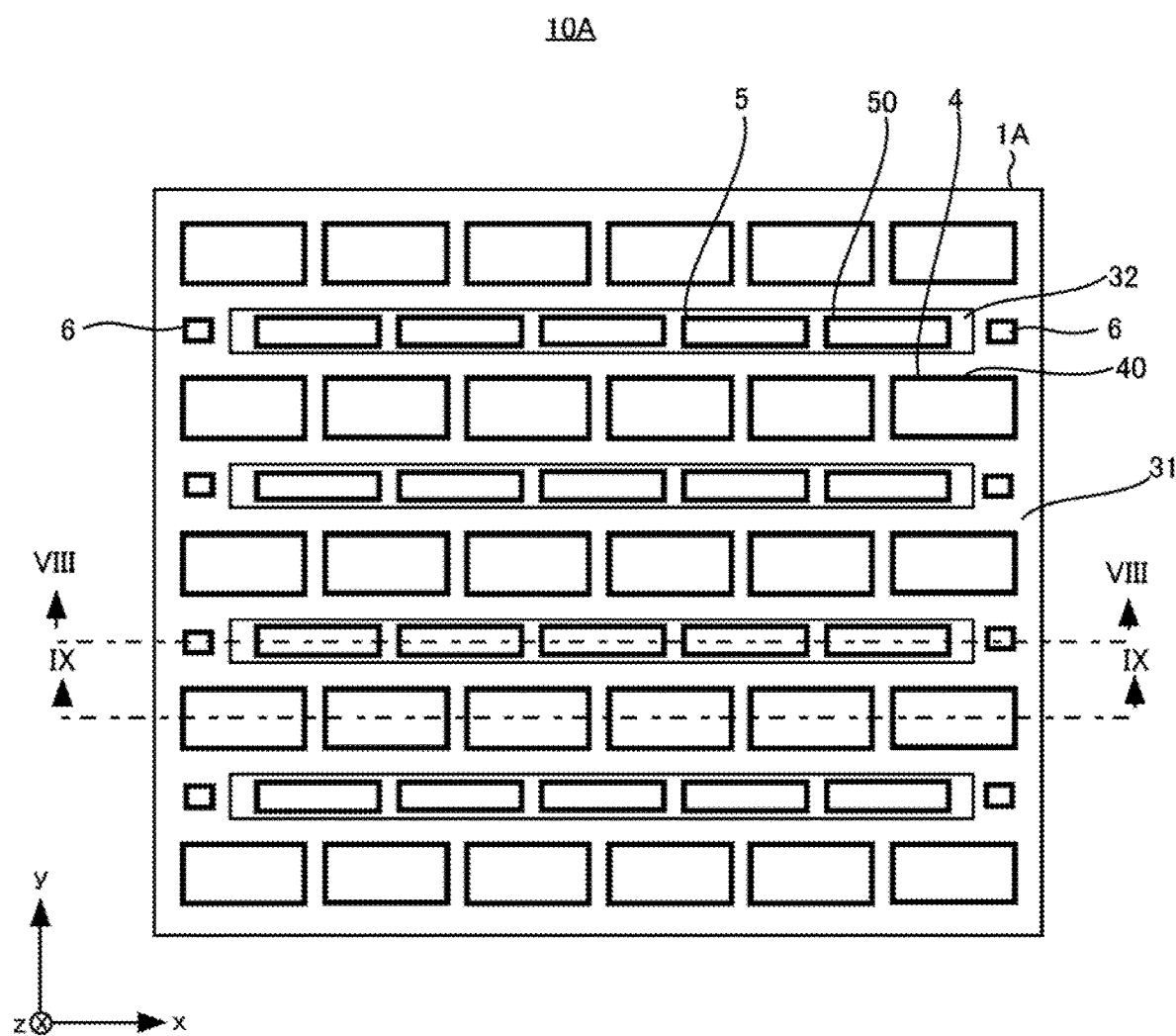
FIG. 7A is a first plan view of a photovoltaic device in accordance with Embodiment 2.
Figure 7B:
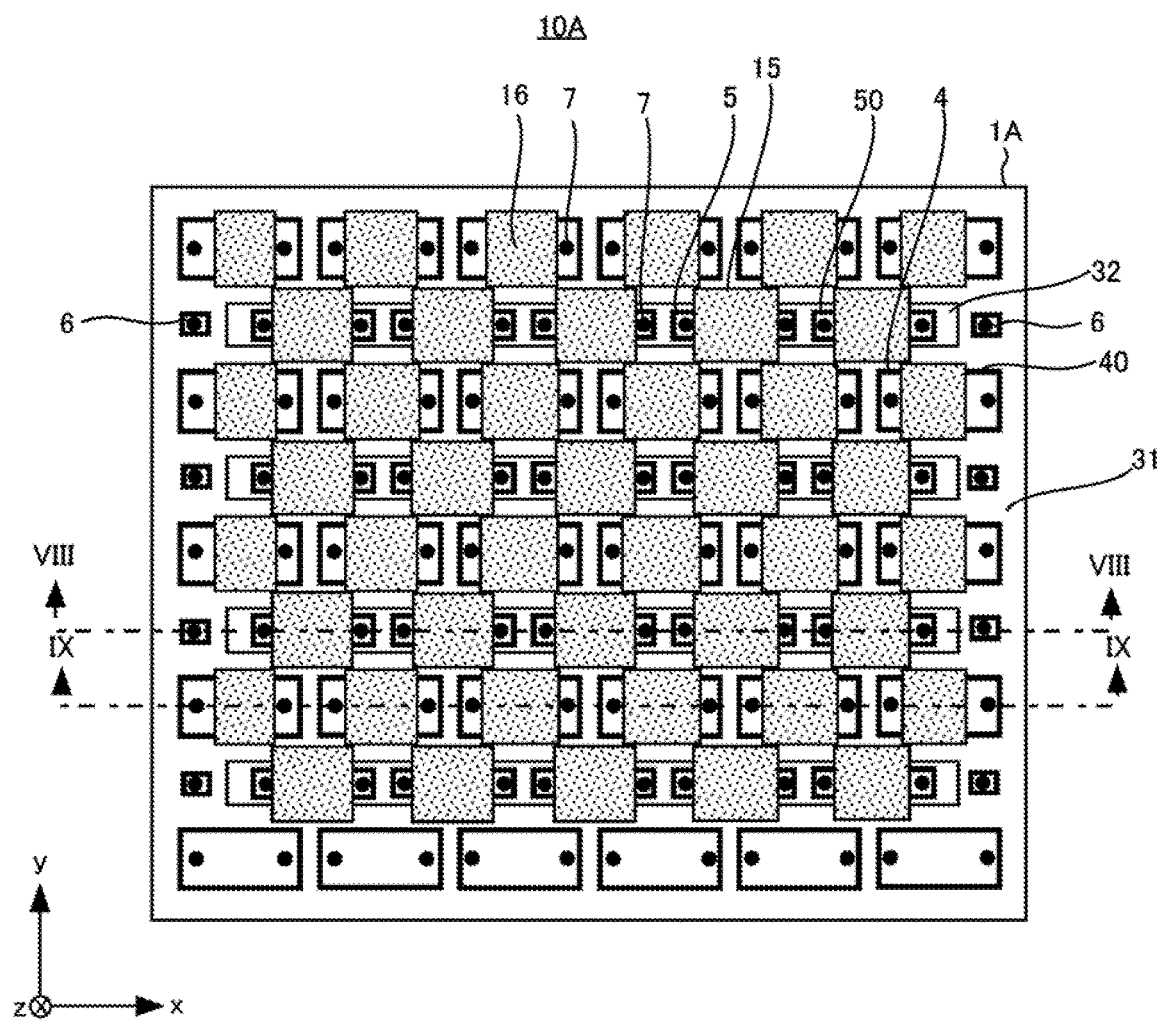
FIG. 7B is a second plan view of the photovoltaic device in accordance with Embodiment 2.
Figure 7C:
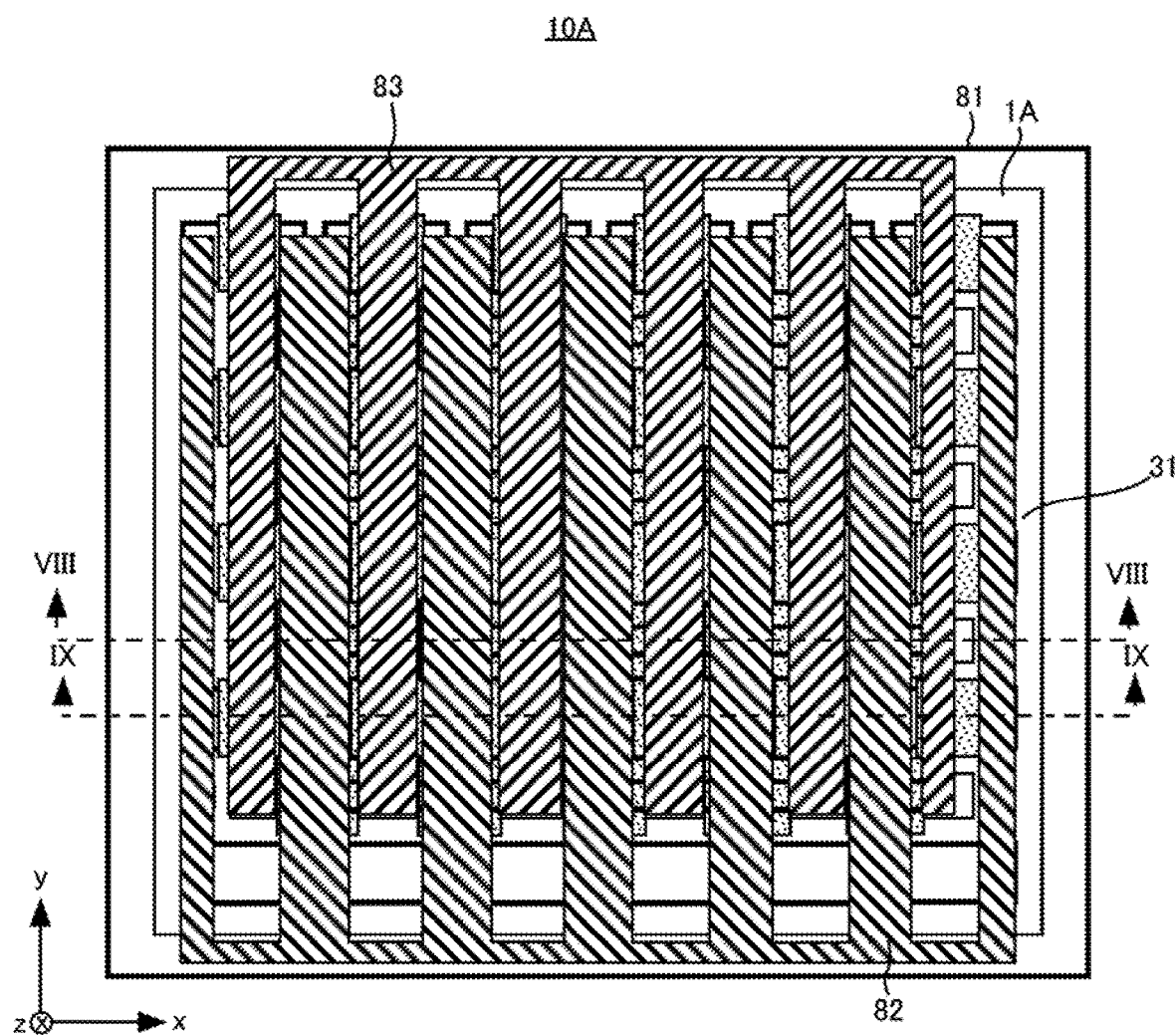
FIG. 7C is a third plan view of the photovoltaic device in accordance with Embodiment 2.
Figure 8:
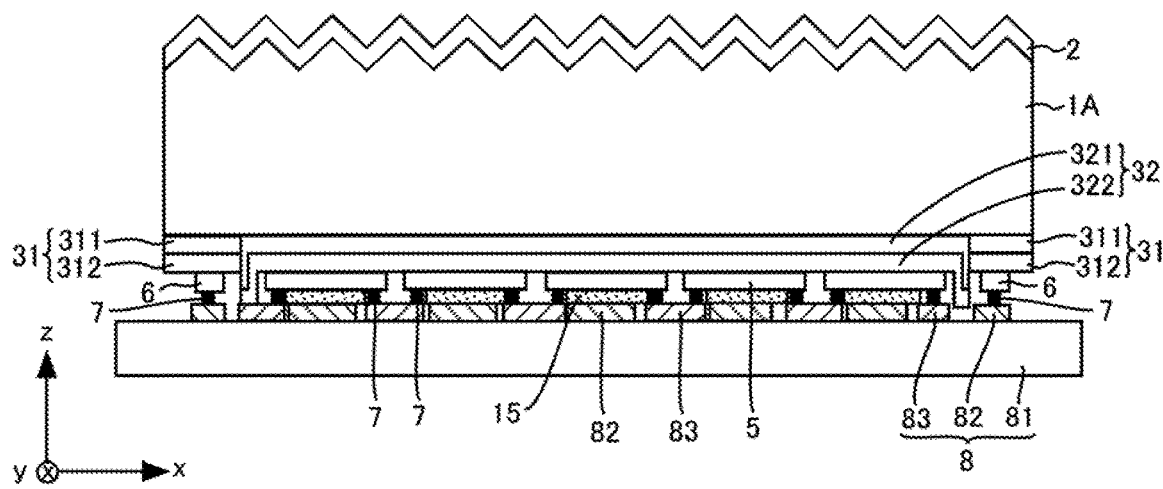
FIG. 8 is a cross-sectional view of the photovoltaic device, taken along line VIII-VIII in FIGS. 7A to 7C.
Figure 9:
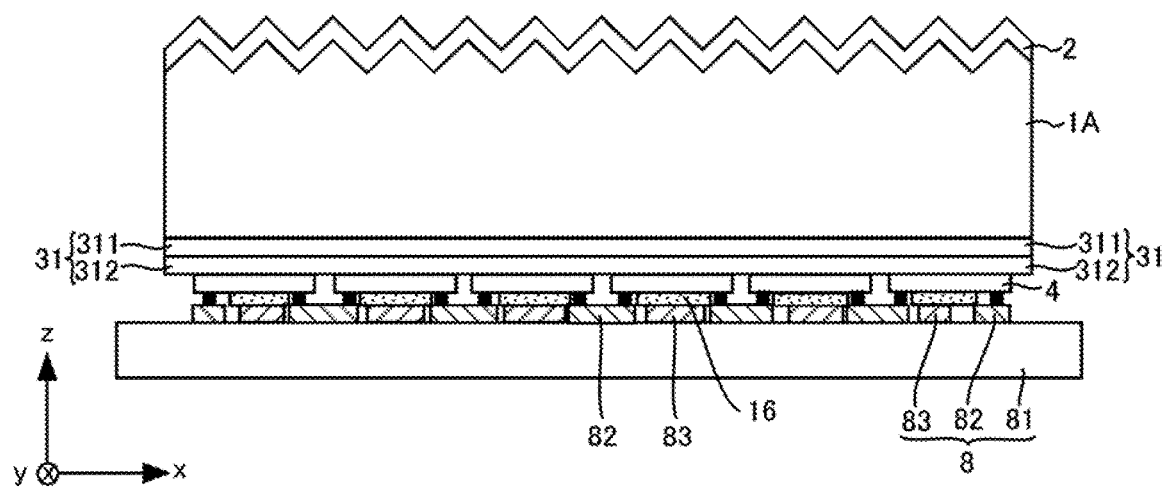
FIG. 9 is a cross-sectional view of the photovoltaic device, taken along line IX-IX in FIGS. 7A to 7C.

FIGS. 7A to 7C are first to third plan views, respectively, of a photovoltaic device in accordance with Embodiment 2. FIG. 8 is a cross-sectional view of the photovoltaic device, taken along line VIII-VIII in FIGS. 7A to 7C. FIG. 9 is a cross-sectional view of the photovoltaic device, taken along line IX-IX in FIGS. 7A to 7C. FIG. 7A shows, in plan view, first amorphous semiconductor layers, second amorphous semiconductor layers, and electrodes of the photovoltaic device as viewed from the side that is opposite a light-incident side thereof. FIG. 7B shows, in plan view, conductive adhesion layers and non-connecting regions of the photovoltaic device as viewed from the side that is opposite the light-incident side. FIG. 7C shows, in plan view, wires and an insulating substrate of the photovoltaic device as viewed from the side that is opposite the light-incident side. FIG. 7C depicts the insulating substrate as being transparent, so that the wires are visible. An x-axis, a y-axis, and a z-axis are defined as indicated in FIGS. 7A to 7C, 8, and 9.

Referring to FIGS. 7A to 7C, 8, and 9, a photovoltaic device 10A in accordance with Embodiment 2 includes a semiconductor substrate 1A in place of the semiconductor substrate 1 of the photovoltaic device 10 shown in FIGS. 1A to 1C, 2, and 3 and a plurality of first amorphous semiconductor layers 31 and a plurality of second amorphous semiconductor layers 32 in place of the passivation film 3. Otherwise, the photovoltaic device 10A is the same as the photovoltaic device 10.

The semiconductor substrate 1A is built around, for example, an n-type monocrystalline silicon substrate and has a thickness of 100 to 200 μm. The semiconductor substrate 1A has, for example, a crystal orientation in the (100) direction and a specific resistance of 1 to 10 Ωcm. The semiconductor substrate 1A has texture on a light-incident-side surface thereof.

The first amorphous semiconductor layers 31 are arranged spaced apart from each other on a surface that is opposite the light-incident-side surface of the semiconductor substrate 1A. The first amorphous semiconductor layers 31 are arranged so as to surround the second amorphous semiconductor layers 32 in the x-y plane. Each first amorphous semiconductor layer 31 includes an i-type amorphous semiconductor layer 311 and a p-type amorphous semiconductor layer 312.

The i-type amorphous semiconductor layer 311 is disposed on the semiconductor substrate 1A in contact with the semiconductor substrate 1A. The i-type amorphous semiconductor layer 311 is composed of, for example, i-type amorphous silicon, i-type amorphous silicon carbide, i-type amorphous silicon nitride, i-type amorphous silicon oxide, or i-type amorphous silicon nitride oxide. The i-type amorphous semiconductor layer 311 has a thickness of, for example, 5 to 30 nm.

The "i-type" semiconductor does not only refer to a completely intrinsic semiconductor, but also encompasses semiconductors contaminated with an n- or p-type impurity of sufficiently low concentration (both the n-type impurity concentration and the p-type impurity concentration are lower than $1 \times 10^{15}$ atoms/cm$^3$).

The "amorphous silicon," throughout the embodiments of the present invention, does not only refer to amorphous silicon containing silicon atoms with a dangling bond (i.e., an unhydrogenated end), but also encompasses hydrogenated amorphous silicon and other like silicon containing no atoms with a dangling bond.

The p-type amorphous semiconductor layer 312 is disposed on the i-type amorphous semiconductor layer 311 in contact with the i-type amorphous semiconductor layer 311. The p-type amorphous semiconductor layer 312 is composed of, for example, p-type amorphous silicon, p-type amorphous silicon carbide, p-type amorphous silicon nitride, p-type amorphous silicon oxide, and p-type amorphous silicon nitride oxide. The p-type amorphous semiconductor layer 312 has a thickness of, for example, 5 to 30 nm.

The p-type amorphous semiconductor layer 312 may contain, for example, boron (B) as a p-type impurity. The "p-type" semiconductor, throughout the embodiments of the present invention, has a p-type impurity concentration of at least $1 \times 10^{15}$ atoms/cm$^3$.

The second amorphous semiconductor layers 32 are disposed on the surface that is opposite the light-incident-side surface of the semiconductor substrate 1A and arranged alternately with the first amorphous semiconductor layers 31 along a width direction of the first amorphous semiconductor layers 31 (i.e., along the y-axis direction). Each second amorphous semiconductor layer 32 includes an i-type amorphous semiconductor layer 321 and an n-type amorphous semiconductor layer 322.

The i-type amorphous semiconductor layer 321 is disposed on the semiconductor substrate 1A in contact with the semiconductor substrate 1A. The i-type amorphous semiconductor layer 321 is composed of, for example, i-type amorphous silicon, i-type amorphous silicon carbide, i-type amorphous silicon nitride, i-type amorphous silicon oxide, and i-type amorphous silicon nitride oxide. The i-type amorphous semiconductor layer 321 has a thickness of, for example, 5 to 30 nm.

The n-type amorphous semiconductor layer 322 is disposed on the i-type amorphous semiconductor layer 321 in contact with the i-type amorphous semiconductor layer 321. The n-type amorphous semiconductor layer 322 is composed of, for example, n-type amorphous silicon, n-type amorphous silicon carbide, n-type amorphous silicon nitride, n-type amorphous silicon oxide, and n-type amorphous silicon nitride oxide. The n-type amorphous semiconductor layer 322 has a thickness of, for example, 5 to 30 nm.

The n-type amorphous semiconductor layer 322 may contain, for example, phosphorus (P) as an n-type impurity.

The "n-type" semiconductor, throughout the embodiments of the present invention, has an n-type impurity concentration of at least $1 \times 10^{15}$ atoms/cm$^3$.

The electrodes 4, 5, and 6 may be provided, and the wiring board 8 may be connected, in the same manner as in Embodiment 1.

Figure 10:
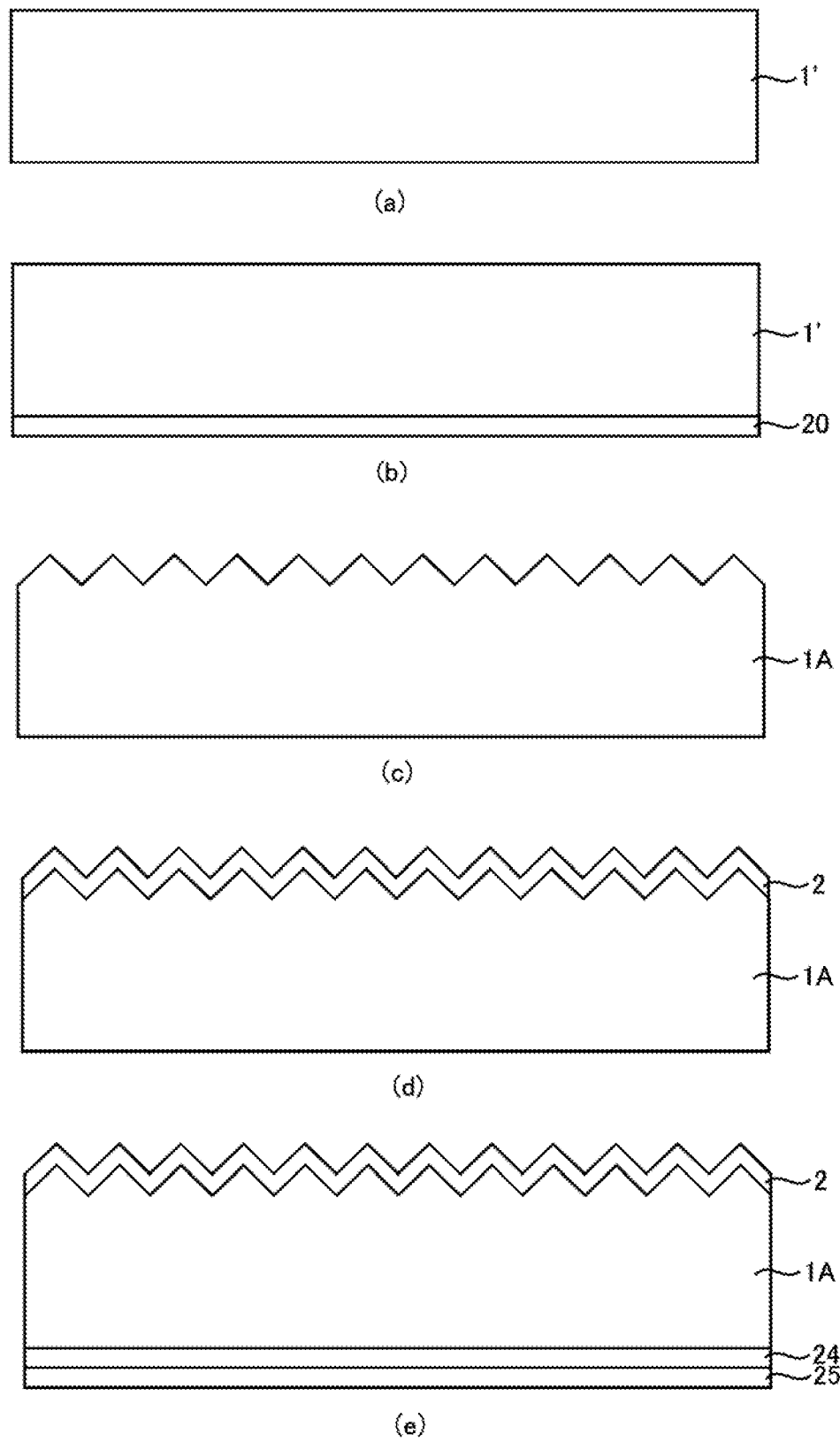
FIG. 10 is a first manufacturing step diagram illustrating manufacturing steps of the photovoltaic device shown in FIGS. 7A to 7C, 8, and 9.
Figure 11:
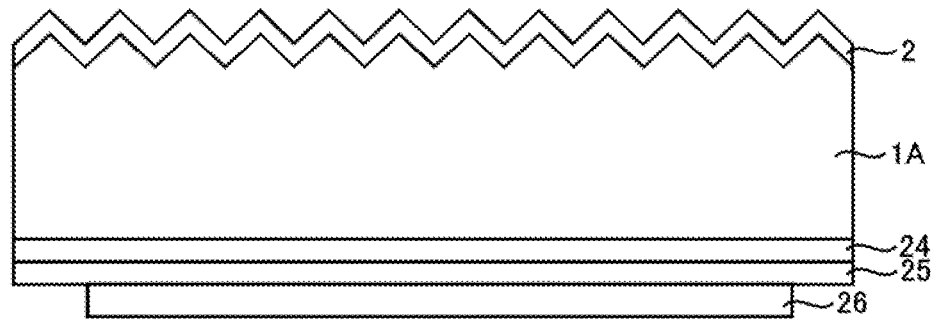
FIG. 11 is a second manufacturing step diagram illustrating manufacturing steps of the photovoltaic device shown in FIGS. 7A to 7C, 8, and 9.
Figure 11:
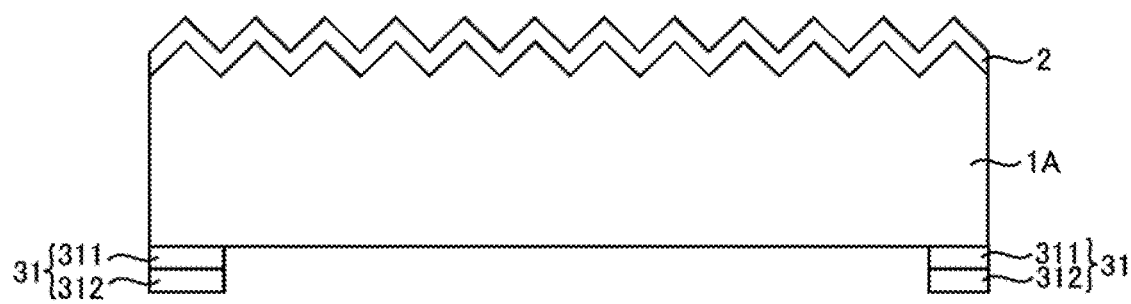
Figure 11:
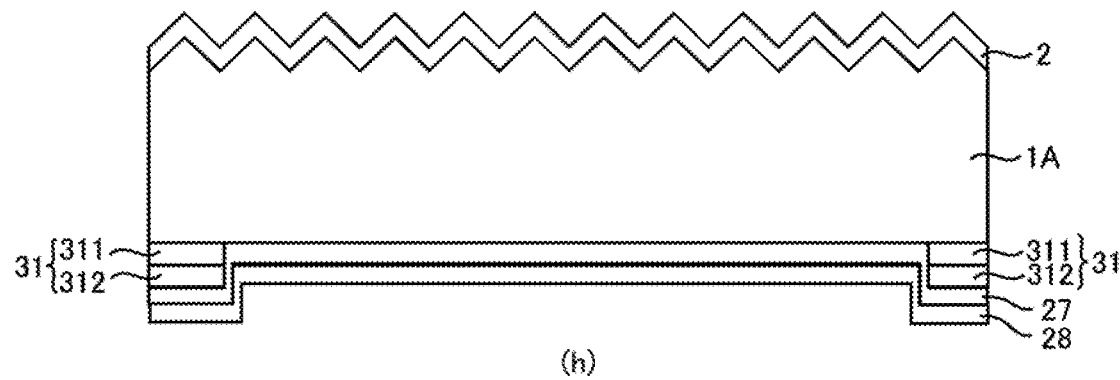
Figure 11:
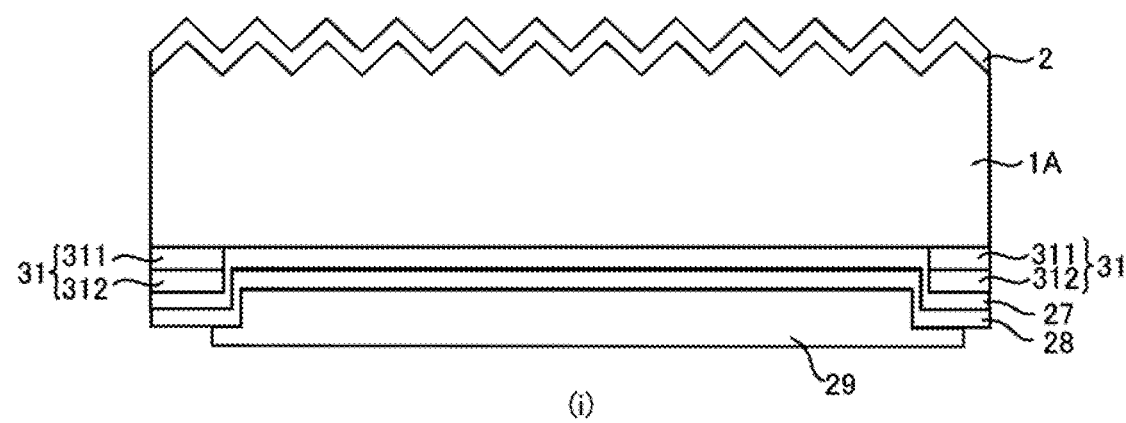
Figure 12:
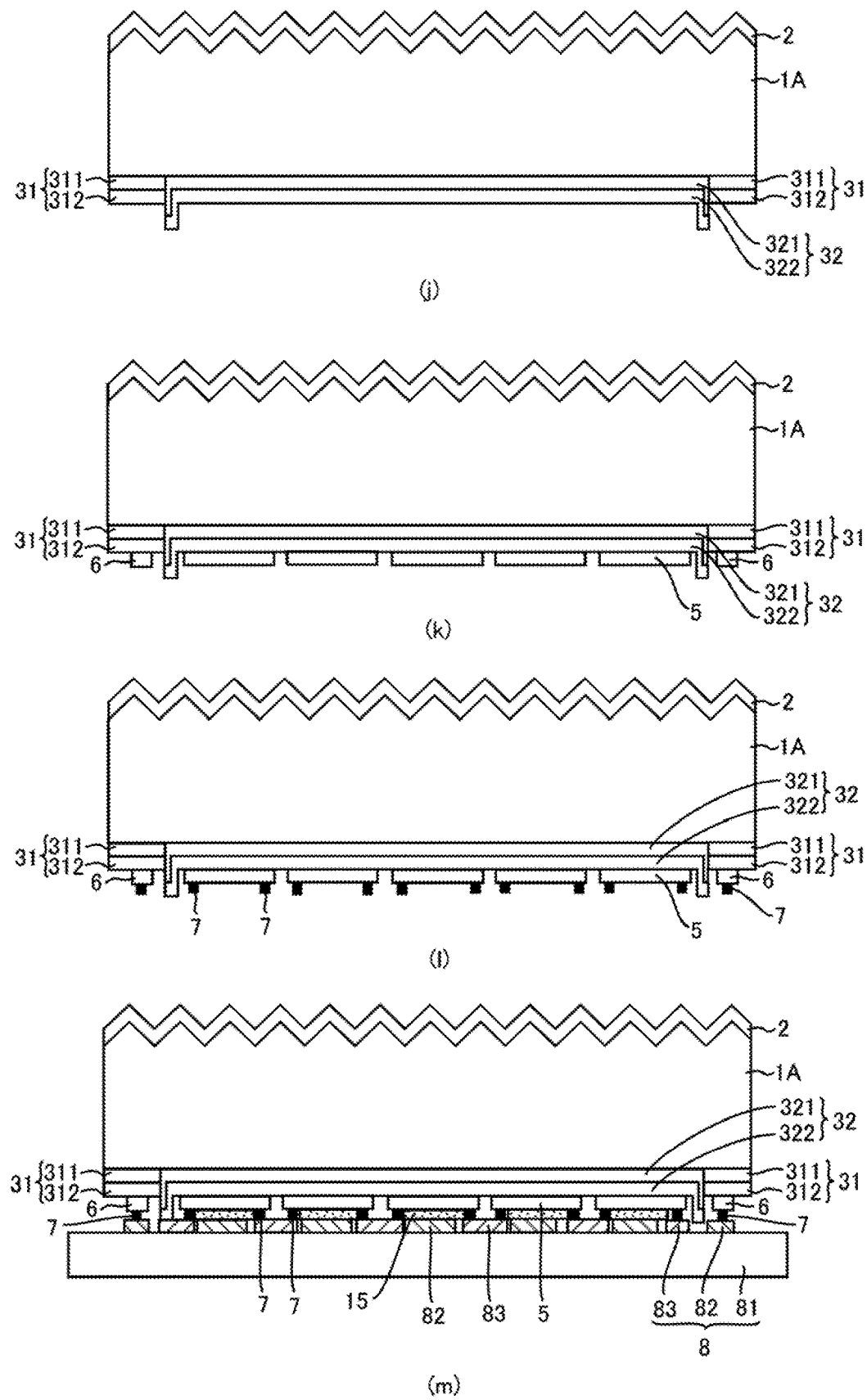
FIG. 12 is a third manufacturing step diagram illustrating manufacturing steps of the photovoltaic device shown in FIGS. 7A to 7C, 8, and 9.

FIGS. 10 to 12 are respectively first to third manufacturing step diagrams illustrating manufacturing steps of the photovoltaic device 10A shown in FIGS. 7A to 7C, 8, and 9. The manufacturing step diagrams in FIGS. 10 to 12 are prepared based on the cross-sectional views taken along line VIII-VIII in FIGS. 7A to 7C.

Referring to FIG. 10, the same steps as steps (a) to (d) shown in FIG. 4 are sequentially carried out at the start of the manufacture of the photovoltaic device 10A. The semiconductor substrate 1A is thus obtained (step (c) in FIG. 10), and the antireflective film 2 is formed on the light-incident-side surface of the semiconductor substrate 1A (step (d) in FIG. 10).

Following step (d), an i-type amorphous semiconductor layer 24 and a p-type amorphous semiconductor layer 25 are sequentially formed on a surface of the semiconductor substrate 1A that is opposite the surface thereof carrying texture (step (e) in FIG. 10). The i-type amorphous semiconductor layer 24 and the p-type amorphous semiconductor layer 25 may be formed by plasma CVD (chemical vapor deposition) or any other method.

Conditions are publicly known for forming the i-type amorphous semiconductor layer 24 by plasma CVD from, for example, i-type amorphous silicon, i-type amorphous silicon carbide, i-type amorphous silicon nitride, i-type amorphous silicon oxide, and i-type amorphous silicon nitride oxide. These publicly known conditions may be used to form the i-type amorphous semiconductor layer 24.

Conditions are publicly known for forming the p-type amorphous semiconductor layer 25 by plasma CVD from, for example, p-type amorphous silicon, p-type amorphous silicon carbide, p-type amorphous silicon nitride, p-type amorphous silicon oxide, and p-type amorphous silicon nitride oxide. These publicly known conditions may be used to form the p-type amorphous semiconductor layer 25.

Following step (e), an etching paste 26 is applied onto the p-type amorphous semiconductor layer 25 (step (f) in FIG. 11). The etching paste 26 may be any material that is capable of etching a laminate of the i-type amorphous semiconductor layer 24 and the p-type amorphous semiconductor layer 25.

Next, parts of the laminate of the i-type amorphous semiconductor layer 24 and the p-type amorphous semiconductor layer 25 are etched out in the thickness direction thereof by heating the etching paste 26 (step (g) in FIG. 11). This step exposes parts of the backside of the semiconductor substrate 1A (the surface that is opposite the surface carrying the texture thereon). The first amorphous semiconductor layers 31, each including an i-type amorphous semiconductor layer 311 and a p-type amorphous semiconductor layer 312, are formed.

An i-type amorphous semiconductor layer 27 is then formed in contact with the exposed surface on the backside of the semiconductor substrate 1A and in contact with the p-type amorphous semiconductor layer 312. Thereafter, an n-type amorphous semiconductor layer 28 is formed in contact with the entire surface of the i-type amorphous semiconductor layer 27 (step (h) in FIG. 11). The i-type amorphous semiconductor layer 27 and the n-type amorphous semiconductor layer 28 may be formed, for example, by plasma CVD or any other method.

Conditions are publicly known for forming the i-type amorphous semiconductor layer 27 by plasma CVD from, for example, i-type amorphous silicon, i-type amorphous silicon carbide, i-type amorphous silicon nitride, i-type amorphous silicon oxide, and i-type amorphous silicon nitride oxide. These publicly known conditions may be used to form the i-type amorphous semiconductor layer 27.

Conditions are publicly known for forming the n-type amorphous semiconductor layer 28 by plasma CVD from, for example, n-type amorphous silicon, n-type amorphous silicon carbide, n-type amorphous silicon nitride, n-type amorphous silicon oxide, and n-type amorphous silicon nitride oxide. These publicly known conditions may be used to form the n-type amorphous semiconductor layer 28.

Following step (h), an etching mask 29 is applied onto the n-type amorphous semiconductor layer 28 (step (i) in FIG. 11). The etching mask 29 may be of any material that is capable of serving as a mask in etching a laminate of the i-type amorphous semiconductor layer 27 and the n-type amorphous semiconductor layer 28.

Next, parts of the laminate of the i-type amorphous semiconductor layer 27 and the n-type amorphous semiconductor layer 28 are etched out in the thickness direction thereof by using the etching mask 29 as a mask. The etching mask 29 is then removed. This step exposes parts of the surface of the p-type amorphous semiconductor layer 312 (step (j) in FIG. 12). The second amorphous semiconductor layers 32, each including an i-type amorphous semiconductor layer 321 and an n-type amorphous semiconductor layer 322, are formed.

Then, the electrodes 6 are formed on the p-type amorphous semiconductor layer 312, and the electrodes 5 are formed on the n-type amorphous semiconductor layer 322 (step (k) in FIG. 12). The electrodes 4 (not shown in step (k)) are formed on the p-type amorphous semiconductor layer 312 simultaneously with the electrodes 5 and 6. The electrodes 4 to 6 may be formed by sputtering or vapor deposition using a metal or other mask. The metal mask has openings where electrodes are to be formed. The openings preferably have a rectangular or other simple shape because there are restrictions on, for example, the opening/non-opening ratio, minimum opening width, and shape that the openings are allowed to take, in order to maintain the mechanical strength of the metal mask. The mechanical strength is easier to maintain if the openings are arranged in a pattern than if the openings are irregularly located. The electrodes 4 to 6 formed in this manner may in some cases have a thickness that increases from the periphery toward the center, depending on the opening width and opening-forming conditions.

Following step (k), a low-melting-point solder paste is provided in the form of dots on the electrodes 4 to 6 by printing or a like technique in order to form the conductive adhesion layers 7 (step (l) in FIG. 12).

Next, the insulating substrate 81 is prepared, which is approximately 150 μm thick. The semiconductor substrate 1A and the wiring board 8 are attached together with their positions adjusted in such a manner that the wire groups 82 and 83 become substantially orthogonal to the electrodes 4 and 6 and the electrodes 5 respectively in order to establish electrical contacts in prescribed locations. Then, for example, pressure and heat are applied to the combined semiconductor substrate 1A and wiring board 8 from both sides thereof to electrically join them, which completes the manufacture of the photovoltaic device 10A (step (m) in FIG. 12).

The photovoltaic device 10A can achieve the same advantages as the photovoltaic device 10 detailed earlier. If a semiconductor layer is formed, electrodes come into contact with the semiconductor layer, and there occurs a large loss of light due to absorption at the interface between the electrodes and the semiconductor layer. If electrodes are arranged spaced apart from each other, the electrodes occupy smaller areas. That reduces the light lost by absorption at the interface between the electrodes and the semiconductor layer. The latter structure also mitigates adverse effects of insufficient passivation of the semiconductor layer under the electrodes, which may occur, for example, due to an irregular thickness of the semiconductor layer, and thereby exhibits improved characteristics. The latter structure is more preferable for these reasons. The electrodes are preferably separated by gaps that are roughly shorter than the diffusion length in the semiconductor substrate of the collected carriers.

In the photovoltaic device 10A, the first amorphous semiconductor layers 31 may include a plurality of first amorphous semiconductor layers arranged spaced apart from each other along the x-axis direction, and the second amorphous semiconductor layers 32 may include a plurality of second amorphous semiconductor layers arranged spaced apart from each other along the x-axis direction.

The description of Embodiment 1 applies to Embodiment 2 unless otherwise mentioned explicitly.

Embodiment 3

Figure 13A:
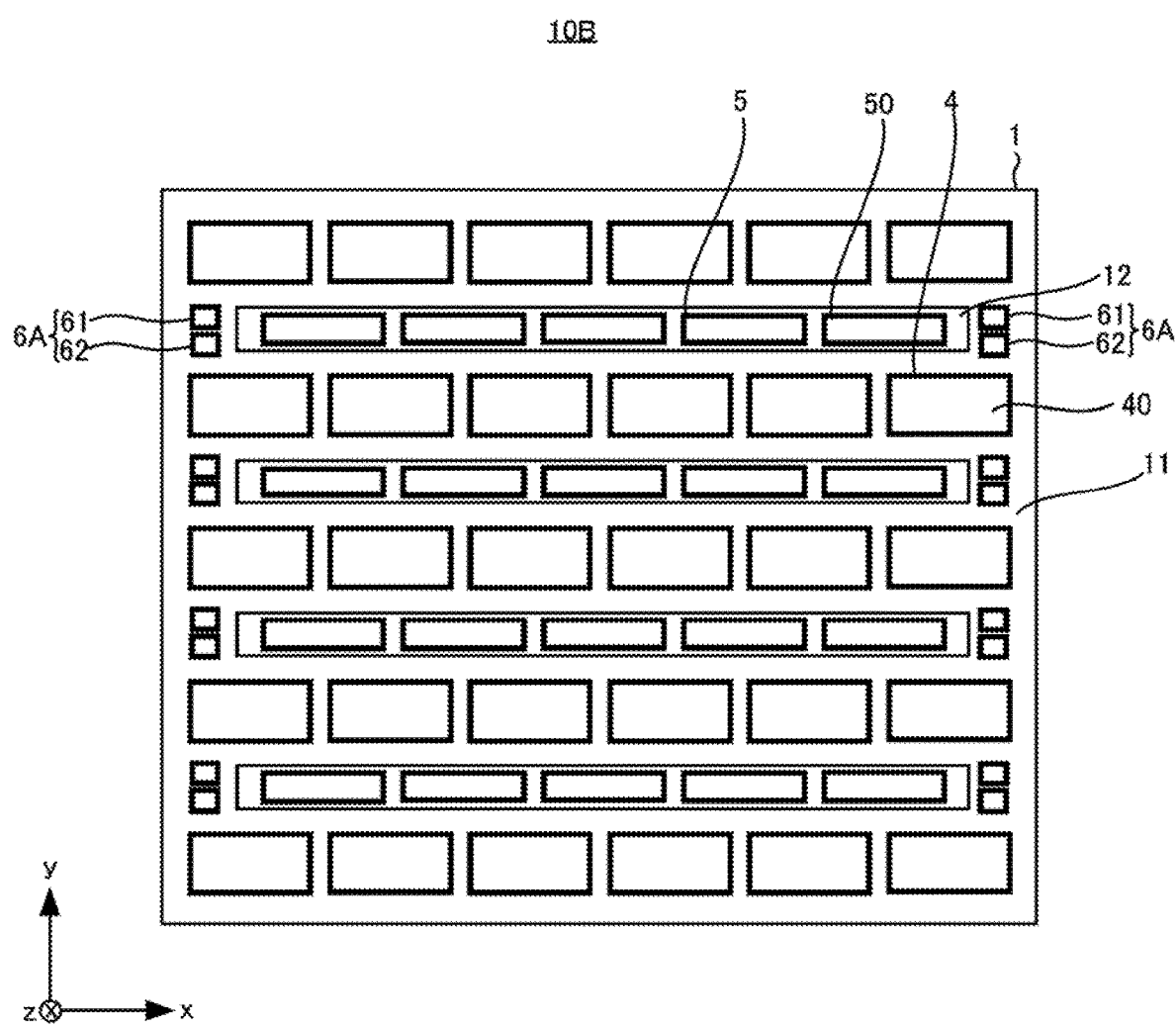
FIG. 13A is a first plan view of a photovoltaic device in accordance with Embodiment 3.
Figure 13B:
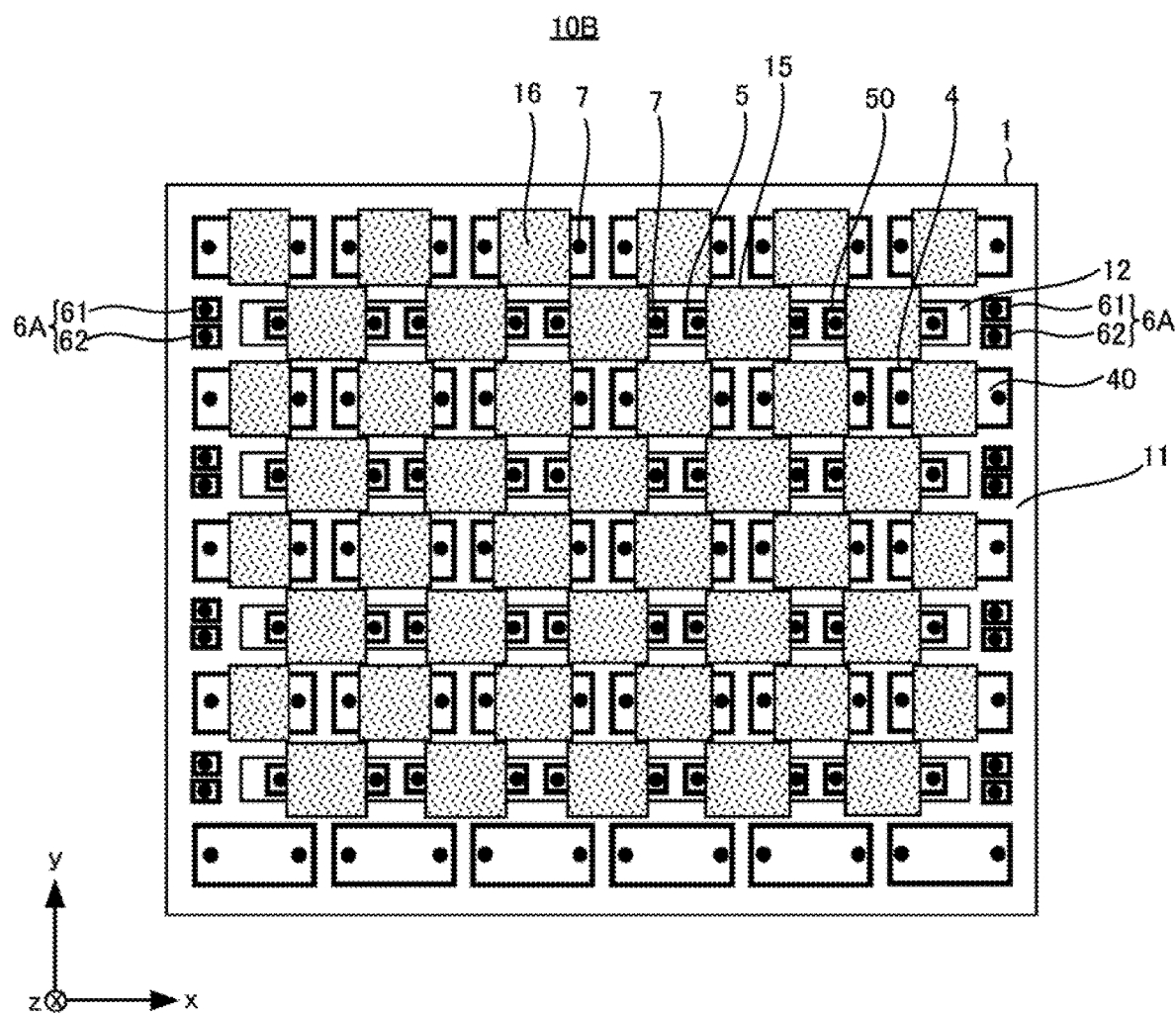
FIG. 13B is a second plan view of the photovoltaic device in accordance with Embodiment 3.
Figure 13C:
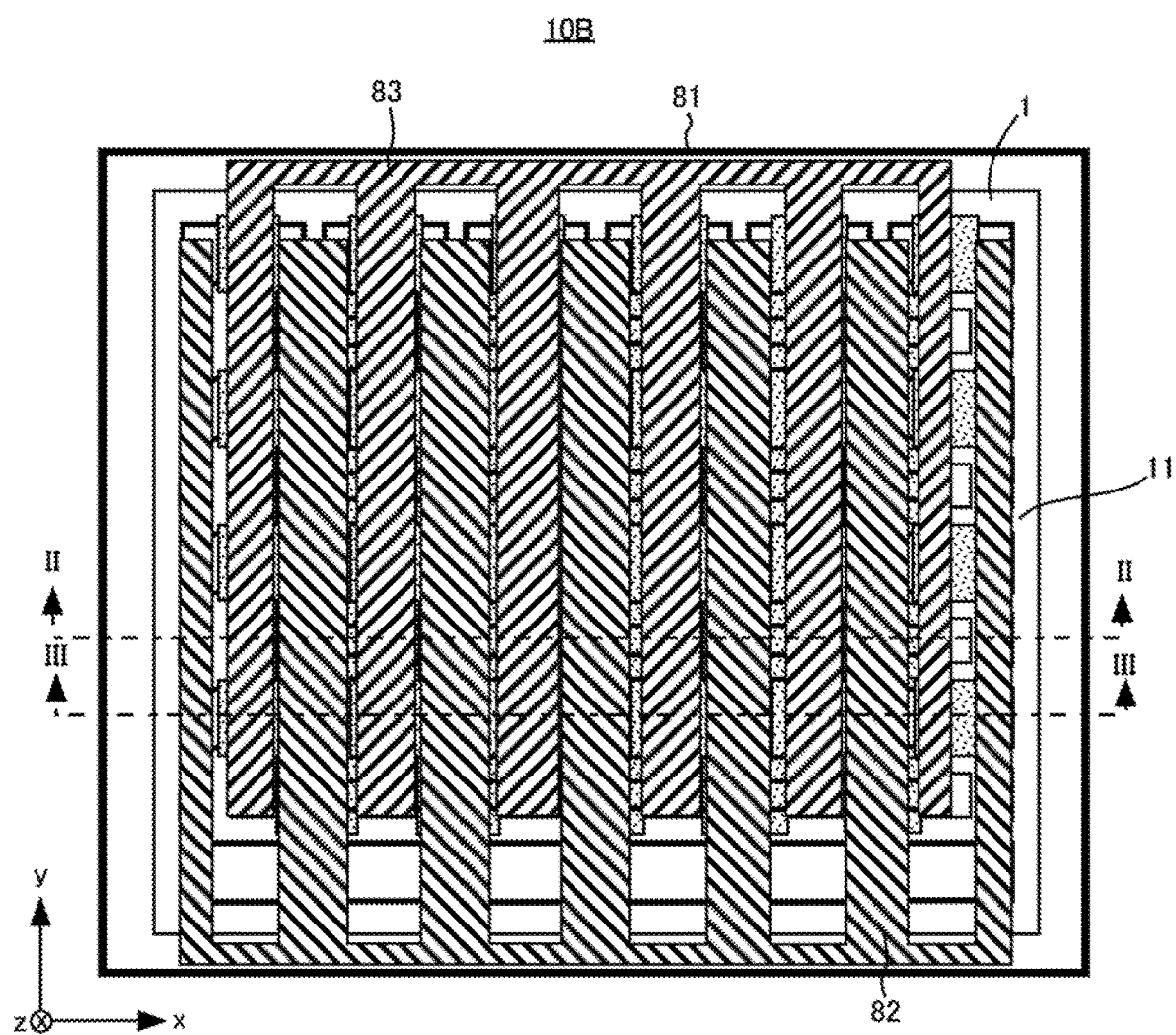
FIG. 13C is a third plan view of the photovoltaic device in accordance with Embodiment 3.

FIGS. 13A to 13C are first to third plan views, respectively, of a photovoltaic device in accordance with Embodiment 3. FIG. 13A shows, in plan view, a p-type diffusion layer, n-type diffusion layers, and electrodes of the photovoltaic device as viewed from the side that is opposite a light-incident side thereof. FIG. 13B shows, in plan view, conductive adhesion layers and non-connecting regions of the photovoltaic device as viewed from the side that is opposite the light-incident side. FIG. 13C shows, in plan view, wires and an insulating substrate of the photovoltaic device as viewed from the side that is opposite the light-incident side. FIG. 13C depicts the insulating substrate as being transparent, so that the wires are visible. An x-axis, a y-axis, and a z-axis are defined as indicated in FIGS. 13A to 13C.

Referring to FIGS. 13A to 13C, a photovoltaic device 10B in accordance with Embodiment 3 includes electrodes 6A in place of the electrodes 6 of the photovoltaic device 10 shown in FIGS. 1A to 1C, 2, and 3. Otherwise, the photovoltaic device 10B is the same as the photovoltaic device 10.

The electrodes 6A are disposed between the edges of the semiconductor substrate 1 and the n-type diffusion layers 12 on both ends of each n-type diffusion layer 12 with respect to the x-axis direction. Preferably, the electrodes 6A are disposed on x-axis wise extensions of the n-type diffusion layers 12.

The electrodes 6A include electrodes 61 and 62. The electrodes 61 and 62 have the same size and thickness as the electrodes 6 and are composed of the same material as the electrodes 6.

The electrodes 61 and 62 are connected to the wire group 82 by the conductive adhesion layers 7.

The electrodes 6A in the photovoltaic device 10B, including the two electrodes 61 and 62, are disposed between those electrodes 4 which are adjacent in the y-axis direction. Therefore, the electrodes 6A collect more carriers near the edges of the semiconductor substrate 1. As a result, the photovoltaic device 10B exhibits improved characteristics over the photovoltaic device 10.

The photovoltaic device 10B is manufactured by steps (a) to (m) shown in FIGS. 4 to 6.

The photovoltaic device in accordance with Embodiment 3 encompasses a photovoltaic device that is obtained by modifying the photovoltaic device 10A shown in FIGS. 7A to 7C, 8, and 9 in the same manner as the photovoltaic device 10 is modified to obtain the photovoltaic device 10B.

The electrodes 6A have been described as being disposed between the edges of the semiconductor substrate 1 and the n-type diffusion layers 12 on both ends of each n-type diffusion layer 12 with respect to the x-axis direction. Alternatively, in Embodiment 3, the electrodes 6A may be disposed between the edges of the semiconductor substrate 1 and at least one of the ends of each n-type diffusion layer 12 with respect to the x-axis direction.

The description of Embodiments 1 and 2 applies to Embodiment 3 unless otherwise mentioned explicitly.

Embodiment 4

Figure 14A:
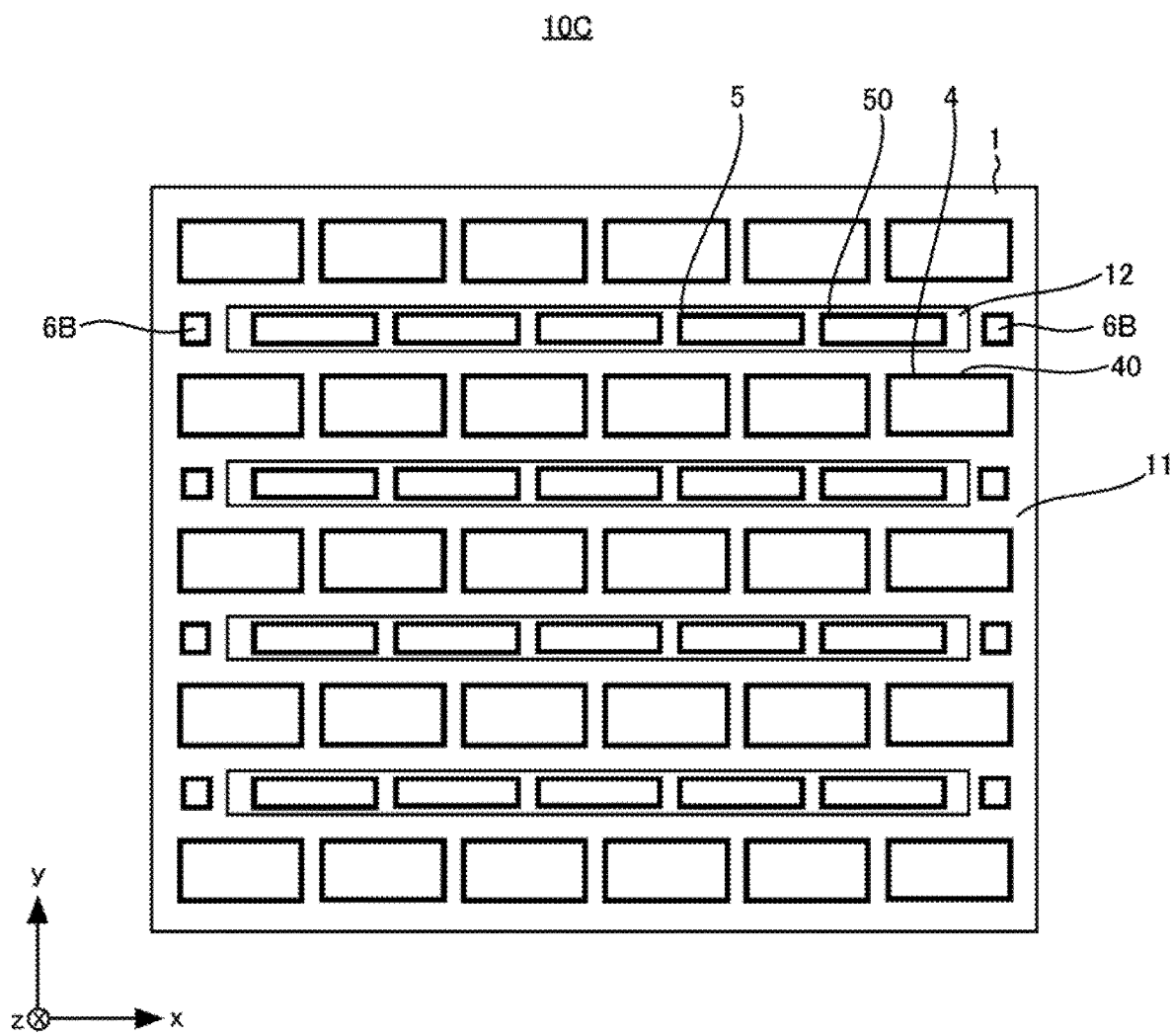
FIG. 14A is a first plan view of a photovoltaic device in accordance with Embodiment 4.
Figure 14B:
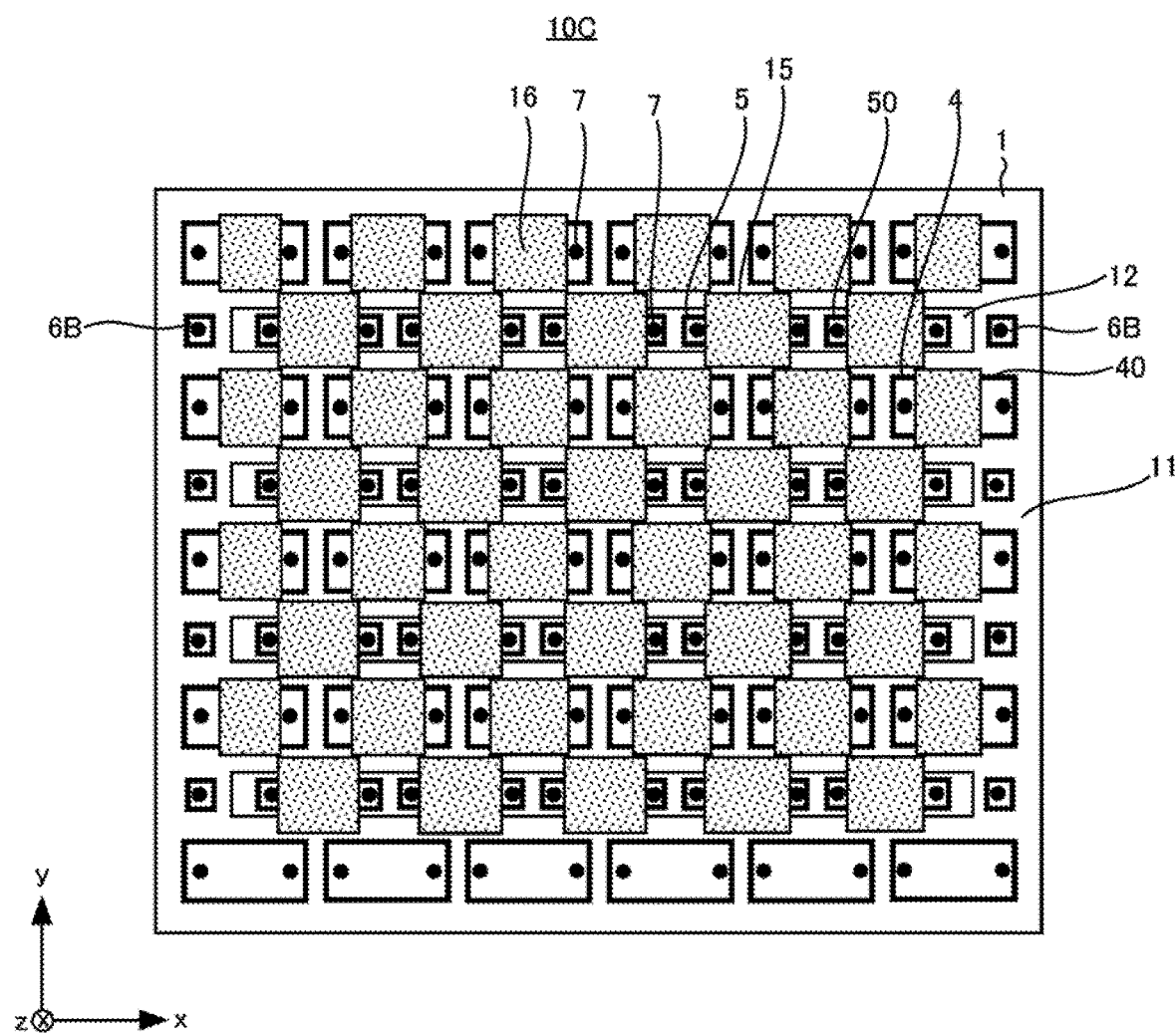
FIG. 14B is a second plan view of the photovoltaic device in accordance with Embodiment 4.
Figure 14C:
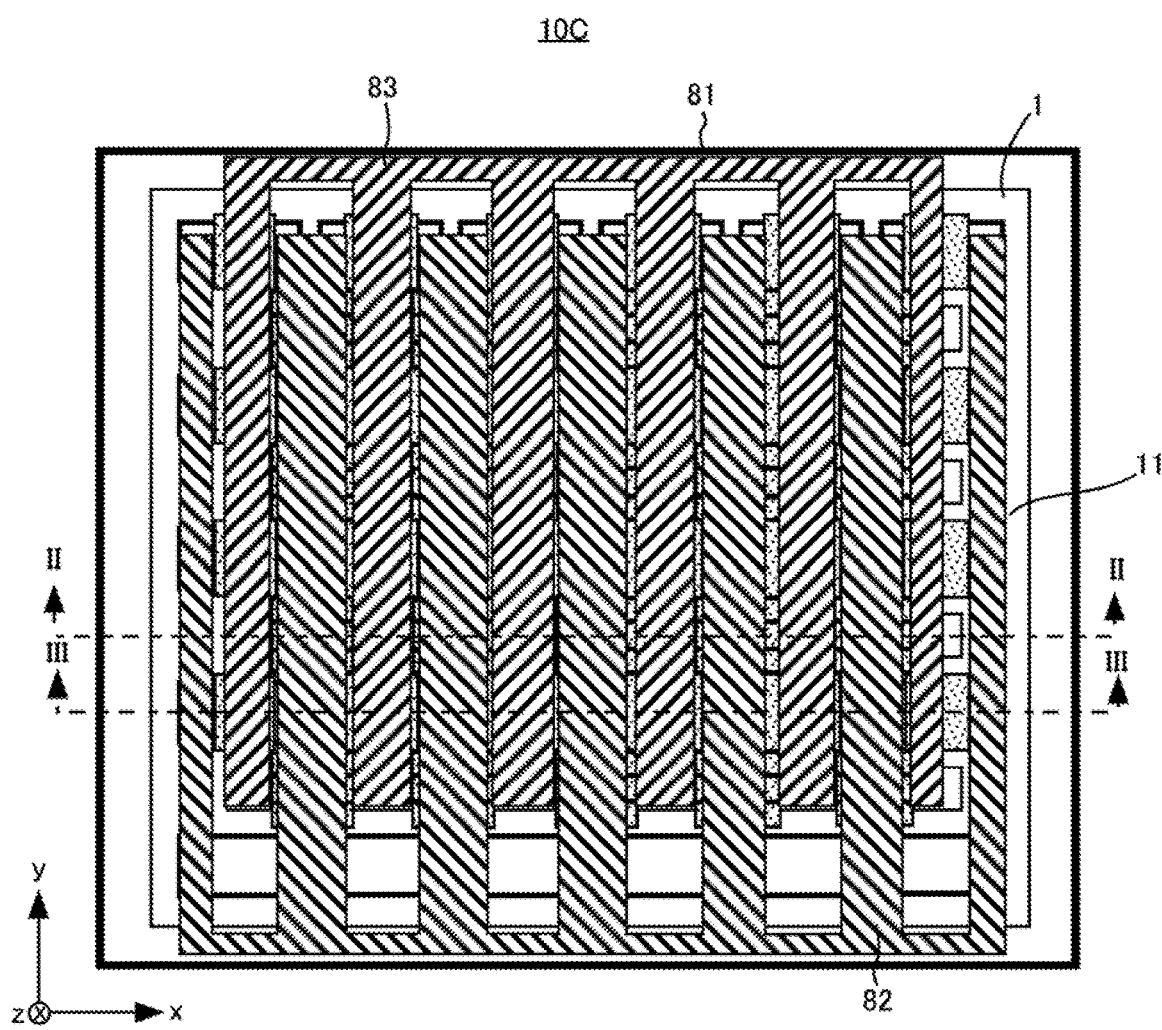
FIG. 14C is a third plan view of the photovoltaic device in accordance with Embodiment 4.

FIGS. 14A to 14C are first to third plan views, respectively, of a photovoltaic device in accordance with Embodiment 4. FIG. 14A shows, in plan view, a p-type diffusion layer, n-type diffusion layers, and electrodes of the photovoltaic device as viewed from the side that is opposite a light-incident side thereof. FIG. 14B shows, in plan view, conductive adhesion layers and non-connecting regions of the photovoltaic device as viewed from the side that is opposite the light-incident side. FIG. 14C shows, in plan view, wires and an insulating substrate of the photovoltaic device as viewed from the side that is opposite the light-incident side. FIG. 14C depicts the insulating substrate as being transparent, so that the wires are visible. An x-axis, a y-axis, and a z-axis are defined as indicated in FIGS. 14A to 14C.

Referring to FIGS. 14A to 14C, a photovoltaic device 10C in accordance with Embodiment 4 includes electrodes 6B in place of the electrodes 6 of the photovoltaic device 10 shown in FIGS. 1A to 1C, 2, and 3. Otherwise, the photovoltaic device 10C is the same as the photovoltaic device 10.

The electrodes 6B are disposed between the edges of the semiconductor substrate 1 and the n-type diffusion layers 12 on both ends of each n-type diffusion layer 12 with respect to the x-axis direction. Preferably, the electrodes 6B are disposed on x-axis wise extensions of the n-type diffusion layers 12.

The electrodes 6B have a y-axis wise length (=width) that is larger than the width of the electrodes 6 and substantially equal to the width of the electrodes 5. In this context, the "width" of the electrodes 5, 6, and 6B refers to an approximate y-axis wise length (width) of their major portions, and "the electrodes 6B having substantially the same width as the electrodes 5" means that the electrodes 5 and 6B appear to have the same width to the naked human eye. These arrangements, for example, alleviate restraints in the design of the mechanical strength of the metal mask used in the formation of electrodes. Optimal design of electrodes thus becomes possible for the width, shape, and other related properties of the electrodes.

The electrodes 6B have the same thickness as the electrodes 6 and are composed of the same material as the electrodes 6. The electrodes 6B are connected to the wire group 82 by the conductive adhesion layers 7.

The electrodes 6B in the photovoltaic device 10C, being wider than the electrodes 6, are disposed between those electrodes 4 which are adjacent in the y-axis direction. Therefore, the electrodes 6B collect more carriers near the edges of the semiconductor substrate 1. As a result, the photovoltaic device 10C exhibits improved characteristics over the photovoltaic device 10.

The photovoltaic device 10C is manufactured by steps (a) to (m) shown in FIGS. 4 to 6.

The photovoltaic device in accordance with Embodiment 4 encompasses a photovoltaic device that is obtained by modifying the photovoltaic device 10A shown in FIGS. 7A to 7C, 8, and 9 in the same manner as the photovoltaic device 10 is modified to obtain the photovoltaic device 10C.

The electrodes 6B have been described as being disposed between the edges of the semiconductor substrate 1 and the n-type diffusion layers 12 on both ends of each n-type diffusion layer 12 with respect to the x-axis direction. Alternatively, in Embodiment 4, the electrodes 6B may be disposed between the edges of the semiconductor substrate 1 and at least one of the ends of each n-type diffusion layer 12 with respect to the x-axis direction.

The description of Embodiments 1 and 2 applies to Embodiment 4 unless otherwise mentioned explicitly.

Variation Examples

Figure 15:
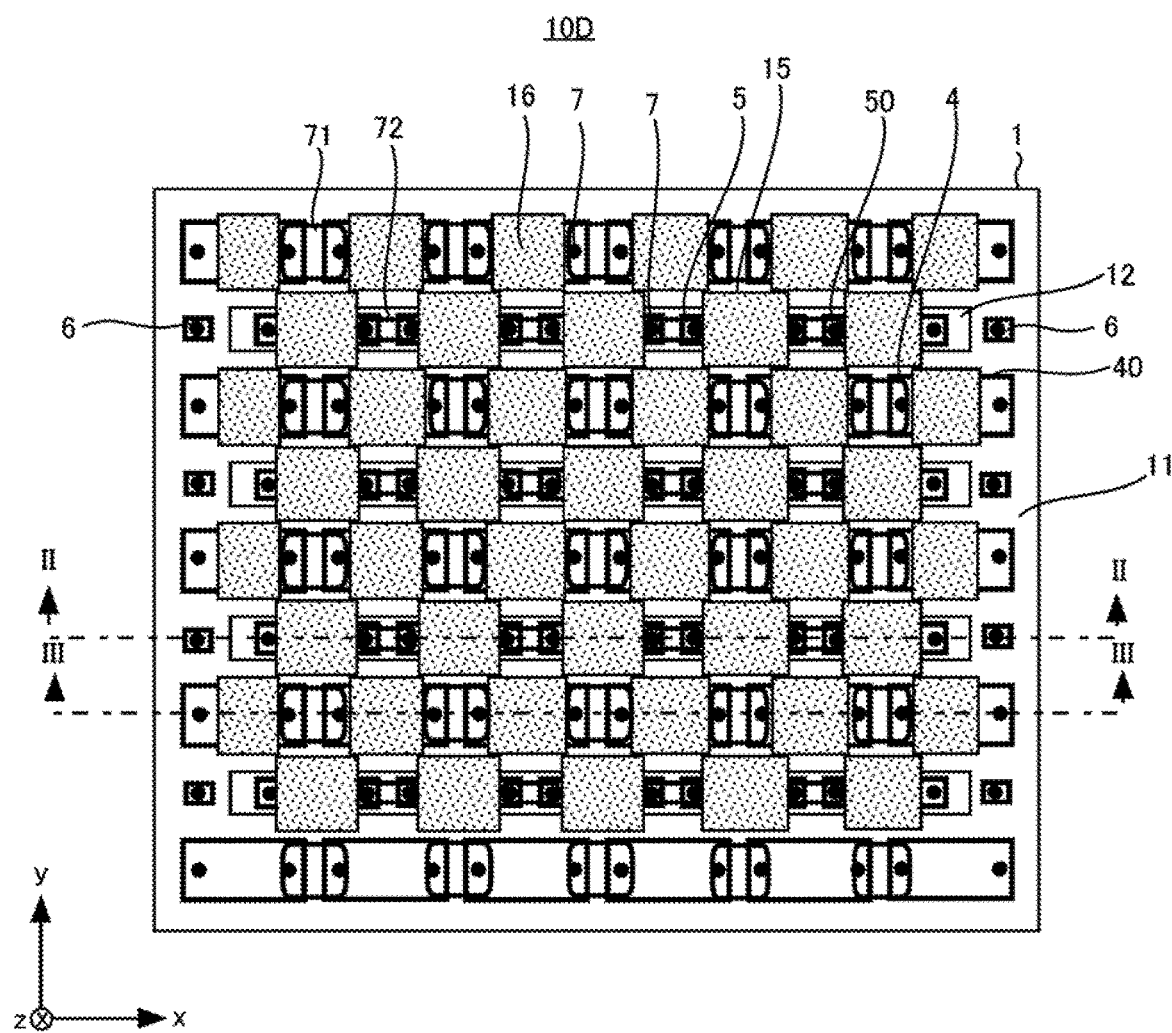
FIG. 15 is a plan view of a variation example of a photovoltaic device in accordance with an embodiment of the present invention.

FIG. 15 is a plan view of a variation example of a photovoltaic device in accordance with an embodiment of the present invention. A photovoltaic device 10D shown in FIG. 15 is a variation example of the photovoltaic device 10 of Embodiment 1. FIG. 15 depicts conductive adhesion layers 71 and 72 as being transparent, so that the underlying components are visible.

Referring to FIG. 15, the photovoltaic device 10D additionally includes the conductive adhesion layers 71 and 72 when compared with the photovoltaic device 10. Otherwise, the photovoltaic device 10D is the same as the photovoltaic device 10.

The conductive adhesion layers 71 are disposed on those electrodes 40 and 40 which are adjacent in the x-axis direction in such a manner as to bridge the gaps between these adjacent electrodes 40 and 40. The conductive adhesion layers 72 are disposed on those electrodes 50 and 50 which are adjacent in the x-axis direction in such a manner as to bridge the gaps between these adjacent electrodes 50 and 50. The conductive adhesion layers 71 and 72 are composed of the same material as the conductive adhesion layers 7. The conductive adhesion layers 71 are connected to the wires 821. The conductive adhesion layers 72 are connected to the wires 831.

The provision of the conductive adhesion layers 71 further enhances the connection of the wires 821 to a pair of electrodes 40 and 40 that are adjacent in the x-axis direction. The provision of the conductive adhesion layers 72 further enhances the connection of the wires 831 to a pair of electrodes 50 and 50 that are adjacent in the x-axis direction. This structure is therefore capable of further alleviating degradation of performance due to differences in characteristics between a pair of electrodes 40 and 40 that are adjacent in the x-axis direction and degradation of performance due to differences in characteristics between a pair of electrodes 50 and 50 that are adjacent in the x-axis direction, thereby realizing even better wire contacts.

The photovoltaic device 10D may include, between a pair of electrodes 40 and 40 below the conductive adhesion layers 71, a layer that prevents contacts with components located further below. The photovoltaic device 10D may either additionally or alternately include, between a pair of electrodes 50 and 50 below the conductive adhesion layers 72, a layer that prevents contacts with components located further below. These layers are, for example, insulating layers composed of an insulating material such as insulating resin or silicon nitride or a similar inorganic material. This structure enables the conductive adhesion layers 71 to be readily formed on those electrodes 40 and 40 which are adjacent in the x-axis direction in such a manner as to bridge the gaps between these adjacent electrodes 40 and 40. The structure also enables the conductive adhesion layers 72 to be readily formed on those electrodes 50 and 50 that are adjacent in the x-axis direction in such a manner as to bridge the gaps between these adjacent electrodes 50 and 50.

The photovoltaic device of this variation example encompasses a photovoltaic device that is obtained by adding the conductive adhesion layers 71 and 72 to any of the photovoltaic devices 10A to 10C.

Figure 16:
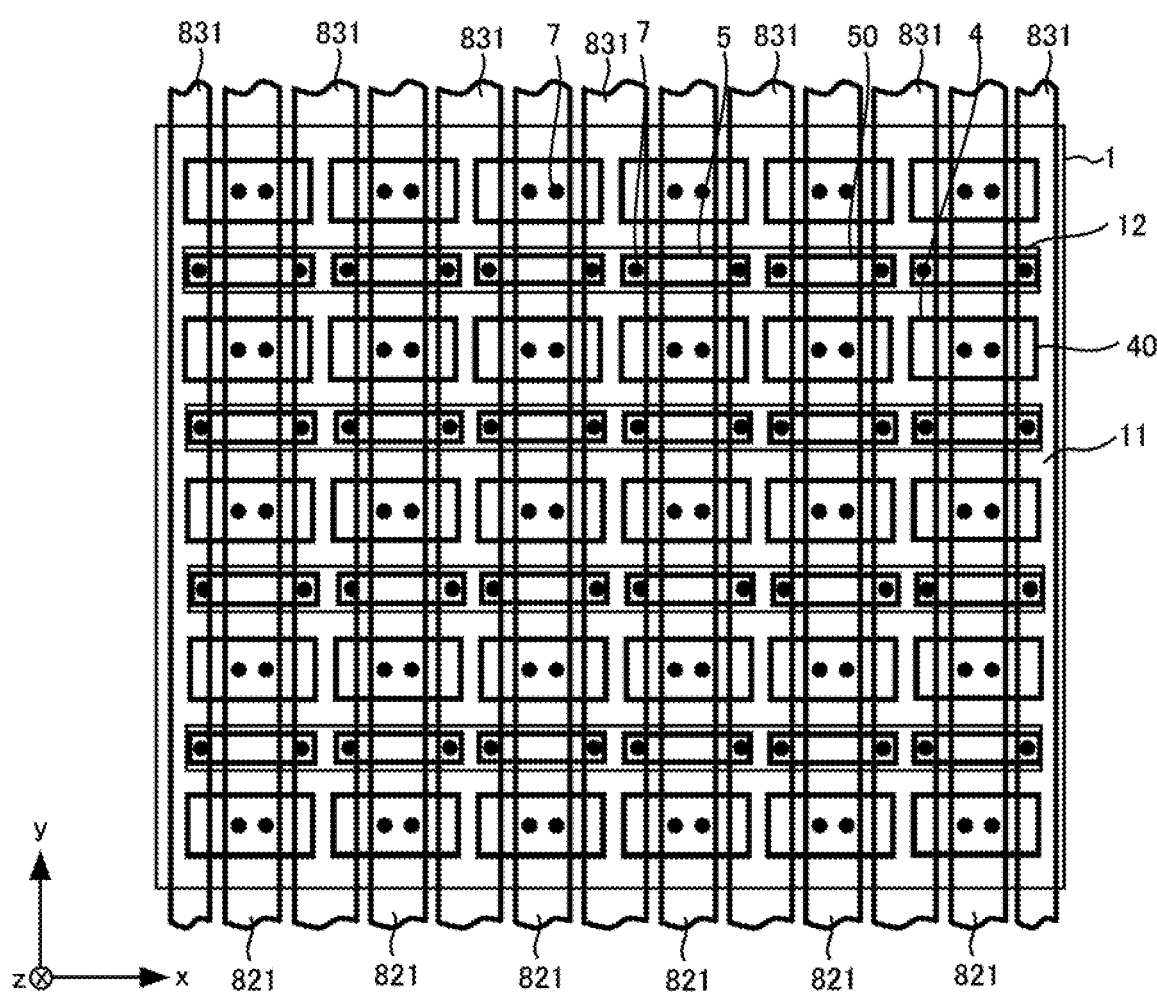
FIG. 16 is a plan view of another variation example of a photovoltaic device in accordance with an embodiment of the present invention.

FIG. 16 is a plan view of another variation example of a photovoltaic device in accordance with an embodiment of the present invention. A photovoltaic device 10E shown in FIG. 16 is a variation example of the photovoltaic device 10 of Embodiment 1. FIG. 16 shows, in plan view, a p-type diffusion layer, n-type diffusion layers, electrodes, conductive adhesion layers, and wires of the photovoltaic device 10E as viewed from the side that is opposite a light-incident side thereof. FIG. 16 does not show the non-connecting regions 15 and 16, so that contacts are visible. FIG. 16 depicts the wires 821 and 831 as being transparent.

Referring to FIG. 16, the photovoltaic device 10E includes a plurality of electrodes 40 and a plurality of electrodes 50 disposed in such a manner that the gaps between those electrodes 40 and 40 which are adjacent in the x-axis direction are in the same locations as the gaps between those electrodes 50 and 50 which are adjacent in the x-axis direction in the photovoltaic device 10 and further includes a conductive adhesion layer 7 disposed at the x-axis wise middle portion of each electrode 40. Otherwise, the photovoltaic device 10E is the same as the photovoltaic device 10.

In the photovoltaic device 10E, the wires 821 are connected to the electrodes 4 (electrodes 40) via the conductive adhesion layers 7, and the wires 831 are connected to the electrodes 5 (electrodes 50) via the conductive adhesion layers 7. As a result, a pair of electrodes 50 and 50 that are adjacent in the x-axis direction is connected to one of the wires 831. One of the electrodes 50 is connected to two of the wires 831 and 831 via those two conductive adhesion layers 7 which are located at far ends with respect to the x-axis direction. One of the electrodes 40 is connected to one of the wires 821 via those two conductive adhesion layers 7 which are located at the x-axis wise middle portion.

The photovoltaic device 10E may include a conductive adhesion layer 7 disposed at both ends of each electrode 40 with respect to the x-axis direction and also at the x-axis wise middle portion of each electrode 50. In this structure, a pair of electrodes 40 and 40 that are adjacent in the x-axis direction is connected to one of the wires 821. One of the electrodes 40 is connected to two of the wires 821 and 821 via those two conductive adhesion layers 7 which are located at both ends with respect to the x-axis direction. One of the electrodes 50 is connected to one of the wires 831 via those two conductive adhesion layers 7 which are located at the x-axis wise middle portion.

Therefore, in the photovoltaic device 10E, either a pair of electrodes 40 and 40 that are adjacent in the x-axis direction or a pair of electrodes 50 and 50 that are adjacent in the x-axis direction needs only to be connected to one of the wires (either one of the wires 821 or one of the wires 831).

Figure 17:
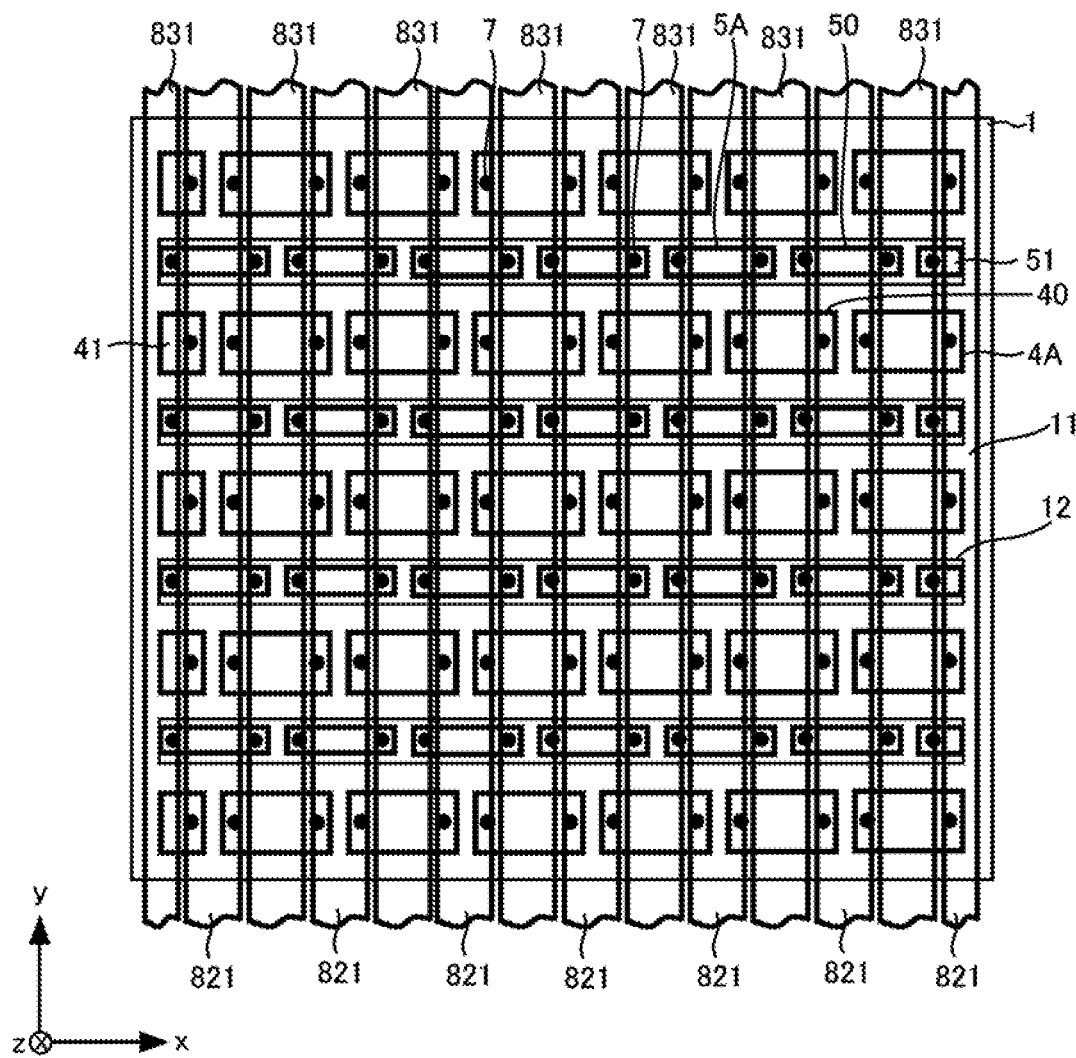
FIG. 17 is a plan view of a further variation example of a photovoltaic device in accordance with an embodiment of the present invention.

FIG. 17 is a plan view of a further variation example of a photovoltaic device in accordance with an embodiment of the present invention. A photovoltaic device 10F shown in FIG. 17 is a variation example of the photovoltaic device 10 of Embodiment 1. FIG. 17 shows, in plan view, a p-type diffusion layer, n-type diffusion layers, electrodes, conductive adhesion layers, and wires of the photovoltaic device 10F as viewed from the side that is opposite a light-incident side thereof. FIG. 17 does not show the non-connecting regions 15 and 16, so that contacts are visible. FIG. 16 depicts the wires 821 and 831 as being transparent.

Referring to FIG. 17, the photovoltaic device 10F includes electrodes 4A and 5A in place of the electrodes 4 and 5 of the photovoltaic device 10. Otherwise, the photovoltaic device 10F is the same as the photovoltaic device 10.

The electrodes 4A include a plurality of electrodes 40 and 41. The electrodes 40 and 41 are disposed in an x-axis wise row at desired intervals. The electrodes 41 have a shorter x-axis wise length than do the electrodes 40 and are disposed along one of the edges of the photovoltaic device 10F with respect to the x-axis direction.

The electrodes 5A include a plurality of electrodes 50 and 51. The electrodes 50 and 51 are disposed in an x-axis wise row at desired intervals. The electrodes 51 have a shorter x-axis wise length than do the electrodes 50 and are disposed along the other edge of the photovoltaic device 10F with respect to the x-axis direction (in other words, the edge of the photovoltaic device 10F with respect to the x-axis direction that is opposite the electrodes 41).

The wires 821 are connected to the electrodes 40 and 41 via the conductive adhesion layers 7. The wires 831 are connected to the electrodes 50 and 51 via the conductive adhesion layers 7.

Embodiment 5

Figure 18:
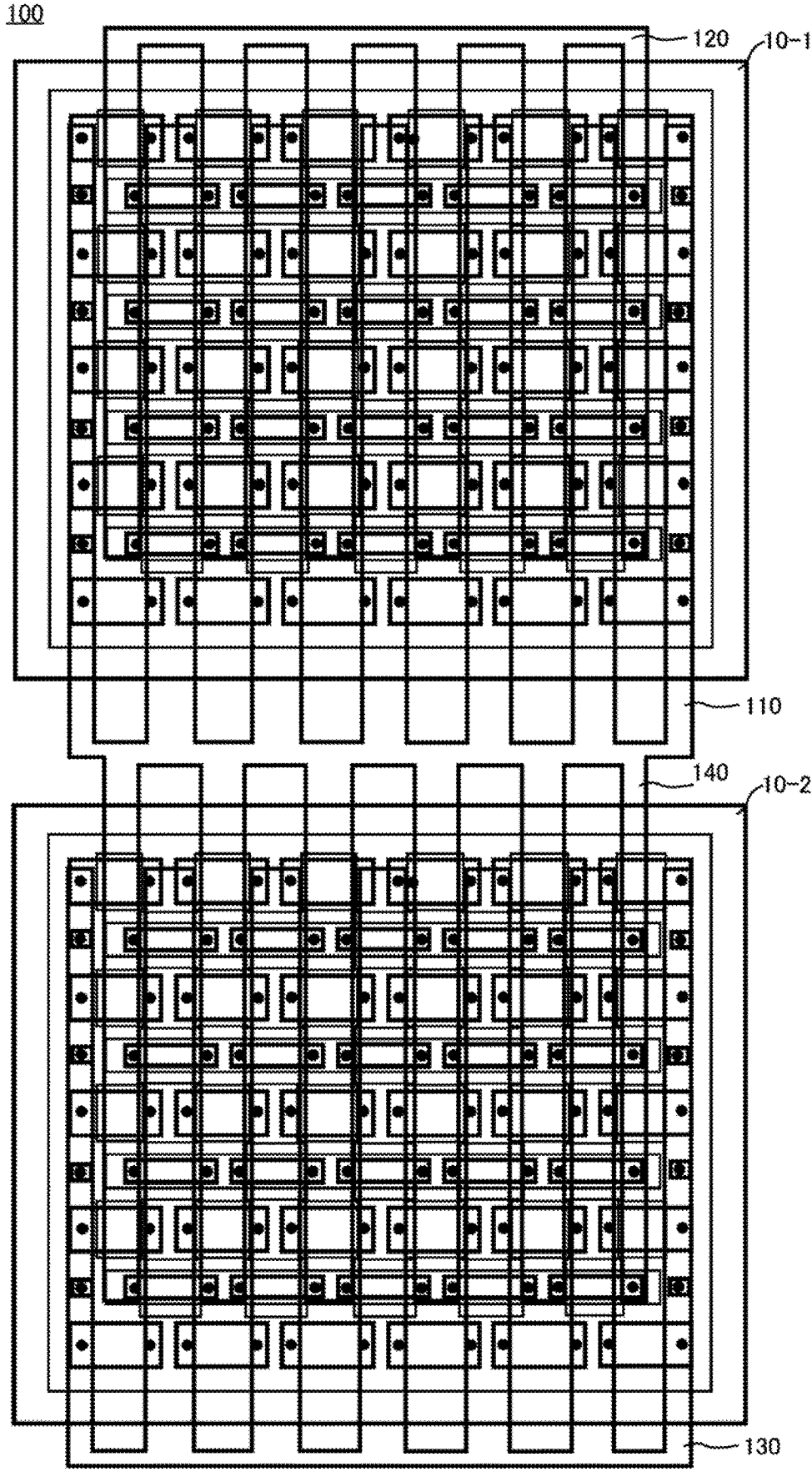
FIG. 18 is a plan view of a solar cell string in accordance with Embodiment 5.

FIG. 18 is a plan view of a solar cell string in accordance with Embodiment 5. FIG. 18 shows, in plan view, a solar cell string as viewed from the side that is opposite a light-incident side thereof. FIG. 18 does not show the non-connecting regions 15 and 16, so that contacts are visible. FIG. 18 depicts wire groups 110, 120, 130, and 140 as being transparent.

Referring to FIG. 18, a solar cell string 100 in accordance with Embodiment 5 includes photovoltaic devices 10-1 and 10-2 and the wire groups 110, 120, 130, and 140. Each photovoltaic device 10-1 and 10-2 includes a photovoltaic device 10 shown in FIGS. 1A to 1C, 2, and 3. Each wire group 110 and 130 includes a wire group 82 described earlier. Each wire group 120 and 140 includes a wire group 83 described earlier. The wire group 110 is connected to the electrodes 4 of the photovoltaic device 10-1. The wire group 120 is connected to the electrodes 5 of the photovoltaic device 10-1. The wire group 130 is connected to the electrodes 4 of the photovoltaic device 10-2. The wire group 140 is connected to the electrodes 5 of the photovoltaic device 10-2. Therefore, the wire group constituted by the wire groups 110 and 120 is connected to the photovoltaic device 10-1. The wire group constituted by the wire groups 130 and 140 is connected to the photovoltaic device 10-2. The wire group 110 is connected to the wire group 140. These arrangements connect the photovoltaic devices 10-1 and 10-2 in series.

Each photovoltaic device 10-1 and 10-2 in the solar cell string 100 may include any one of the photovoltaic devices 10A to 10D described earlier.

Figure 19:
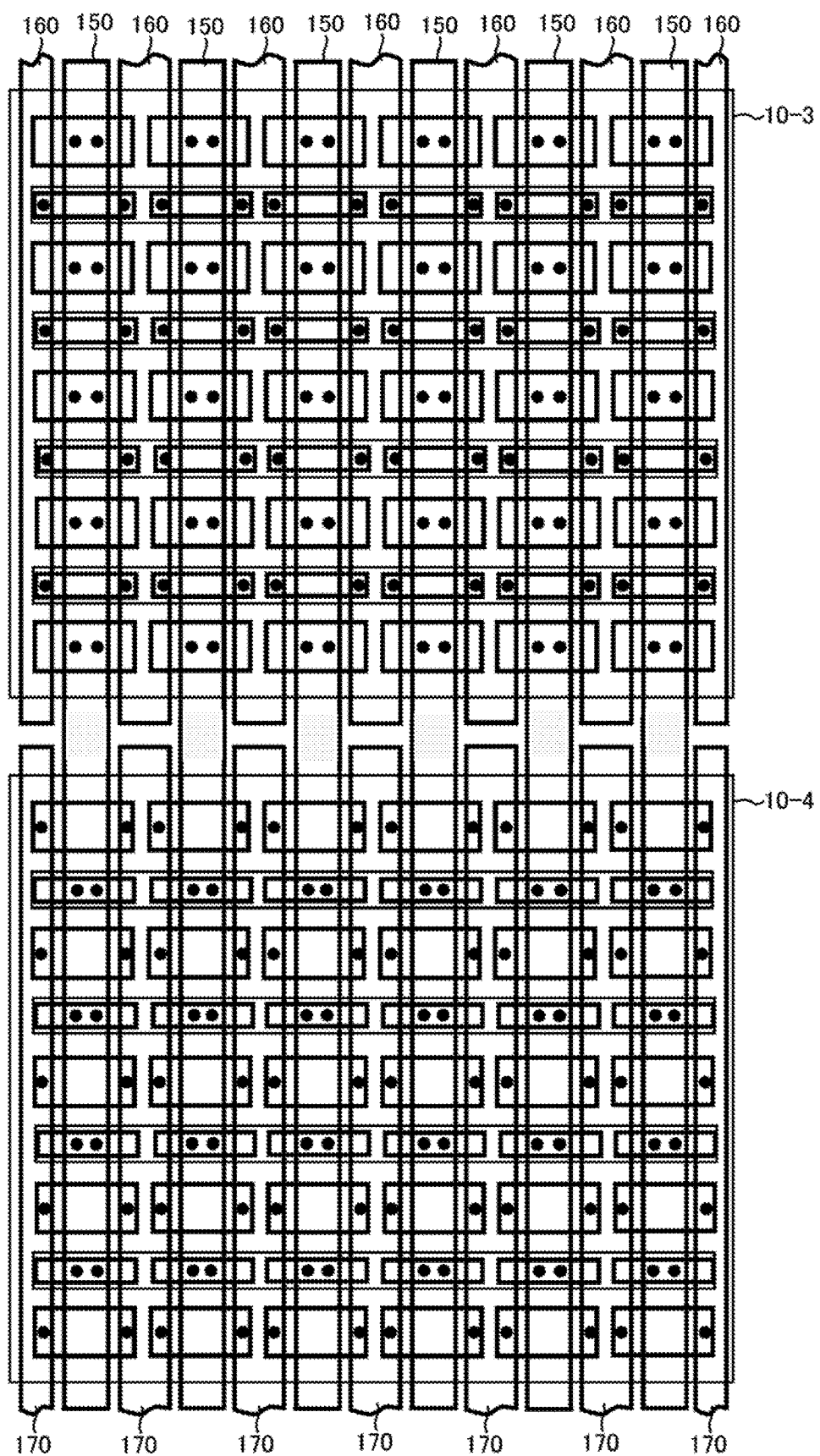
FIG. 19 is a plan view of another solar cell string in accordance with Embodiment 5.

FIG. 19 is a plan view of another solar cell string in accordance with Embodiment 5. FIG. 19 shows, in plan view, a solar cell string as viewed from the side that is opposite a light-incident side thereof. FIG. 19 does not show the non-connecting regions 15 and 16, so that contacts are visible. FIG. 19 depicts wire groups 150, 160, and 170 as being transparent.

Referring to FIG. 19, a solar cell string 100A includes photovoltaic devices 10-3 and 10-4 and the wire groups 150, 160, and 170. The wire groups 150, 160, and 170 are composed of the same material as the wire groups 82 and 83 described earlier.

The photovoltaic device 10-3 includes the photovoltaic device 10E shown in FIG. 16. The photovoltaic device 10-4 is basically the same as the photovoltaic device 10E and differs therefrom in that the photovoltaic device 10-4 includes conductive adhesive 7 disposed at both ends of each electrode 40 with respect to the x-axis direction and also at the x-axis wise middle portion of each electrode 50.

The wire groups 150 are connected to the electrodes 4 (electrodes 40) of the photovoltaic device 10-3 and also to the electrodes 5 (electrodes 50) of the photovoltaic device 10-4. The wire groups 160 are connected to the electrodes 5 (electrodes 50) of the photovoltaic device 10-3. The wire groups 170 are connected to the electrodes 4 (electrodes 40) of the photovoltaic device 10-4. These arrangements connect the photovoltaic devices 10-3 and 10-4 in series.

Figure 20:
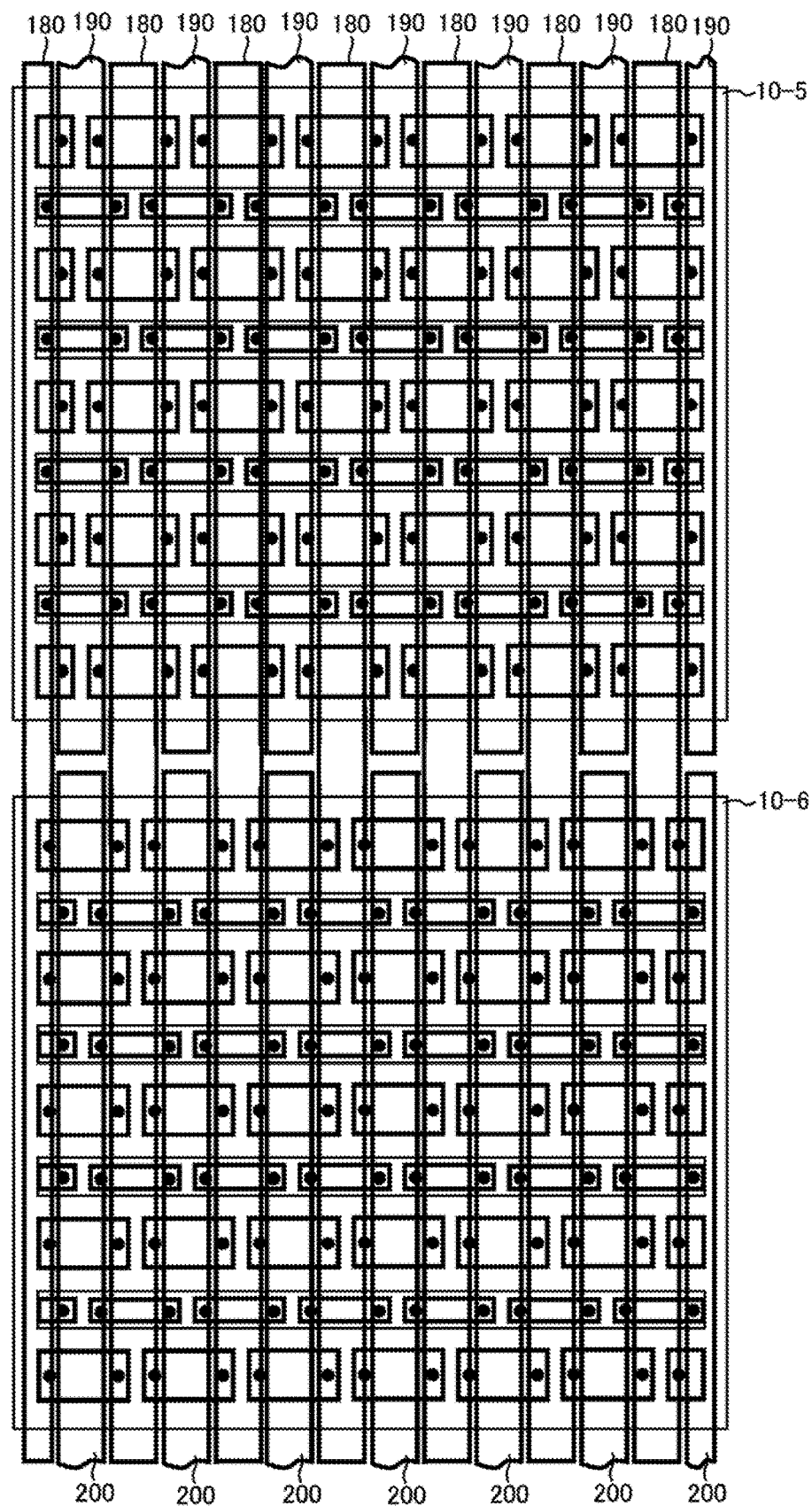
FIG. 20 is a plan view of a further solar cell string in accordance with Embodiment 5.

FIG. 20 is a plan view of a further solar cell string in accordance with Embodiment 5. FIG. 20 shows, in plan view, a solar cell string as viewed from the side that is opposite a light-incident side thereof.

Referring to FIG. 20, a solar cell string 100B includes photovoltaic devices 10-5 and 10-6 and wire groups 180, 190, and 200. The wire groups 180, 190, and 200 are composed of the same material as the wire groups 82 and 83 described earlier. FIG. 20 does not show the non-connecting regions 15 and 16, so that contacts are visible. FIG. 20 depicts the wire groups 180, 190, and 200 as being transparent.

The photovoltaic device 10-5 includes the photovoltaic device 10F shown in FIG. 17. The photovoltaic device 10-6 is basically the same as the photovoltaic device 10F and differs therefrom in that the photovoltaic device 10-6 is rotated 180° in the x-y plane with respect to the photovoltaic device 10F.

The wire groups 180 are connected to the electrodes 5A (electrodes 50) of the photovoltaic device 10-5 and also to the electrodes 4A (electrodes 40) of the photovoltaic device 10-6. The wire groups 190 are connected to the electrodes 4A (electrodes 40 and 41) of the photovoltaic device 10-5. The wire groups 200 are connected to the electrodes 5A (electrodes 50 and 51) of the photovoltaic device 10-6. These arrangements connect the photovoltaic devices 10-5 and 10-6 in series.

In the photovoltaic device 10-5, the wire groups 180 are electrically connected via the electrodes 5A, and the wire groups 190 are electrically connected via the electrodes 4A. In the photovoltaic device 10-6, the wire groups 180 are electrically connected via the electrodes 4A, and the wire groups 200 are electrically connected via the electrodes 5A. Therefore, the solar cell string 100B has characteristics thereof averaged even in the presence of differences in characteristics caused by, for example, partial shadowing, which reduces adverse effects of degradation of performance caused by differences in characteristics.

The y-axis direction is a first direction, and the x-axis direction is a second direction, throughout the embodiments of the present invention.

Throughout the embodiments of the present invention, the n-type diffusion layers 12 or the second amorphous semiconductor layers 32, both arranged along the y-axis direction, constitute a "plurality of first semiconductor layers," and the p-type diffusion layers 11 or the first amorphous semiconductor layers 31, both arranged along the y-axis direction, constitute a "plurality of second semiconductor layers."

Again throughout the embodiments of the present invention, the electrodes 50 (or the electrodes 50 and 51), arranged along the x-axis direction, constitute a "plurality of first electrodes" and a "first electrode group," and the electrodes 40 (or the electrodes 40 and 41), arranged along the x-axis direction, constitute a "plurality of second electrodes" and a "second electrode group."

Again throughout the embodiments of the present invention, the wires 831 constitute a "first wire group," and the wires 821 constitute a "second wire group."

The embodiments disclosed herein are for illustrative purposes only in every respect and provide no basis for restrictive interpretations. The scope of the present invention is defined only by the claims and never bound by the embodiments. Those modifications and variations which may lead to equivalents of claimed elements are all included within the scope of the invention.

INDUSTRIAL APPLICABILITY

The present invention is applicable to photovoltaic devices and to solar cell strings including photovoltaic devices.

What is claimed is:

1. A photovoltaic device comprising:
   a semiconductor substrate of a first conductivity type;
   a plurality of first semiconductor layers of the first conductivity type, the first semiconductor layers being spaced apart from each other in a first direction in an area on one of a plurality of faces of the semiconductor substrate;
   a plurality of second semiconductor layers of a second conductivity type that is opposite the first conductivity type, the second semiconductor layers being disposed alternately with the first semiconductor layers along the first direction in the area on the corresponding face of the semiconductor substrate;
   a plurality of first electrodes on the first semiconductor layers, the first electrodes having a second direction that is orthogonal to the first direction as a lengthwise direction thereof;
   a plurality of second electrodes on the second semiconductor layers, the second electrodes having the second direction as a lengthwise direction thereof;
   a first wire group electrically connected to the first electrodes;
   a second wire group electrically connected to the second electrodes;
   a plurality of first non-connecting regions obstructing electrical connection between the first electrodes and the second wire group; and
   a plurality of second non-connecting regions obstructing electrical connection between the second electrodes and the first wire group,
   wherein:
   the first electrodes are spaced apart from each other in the first direction and include a first electrode group arranged along the second direction;
   the second electrodes are spaced apart from each other in the first direction and include a second electrode group arranged along the second direction;
   the first wire group is arranged along the second direction;
   the second wire group is arranged along the second direction;
   the first non-connecting regions are disposed between those second electrodes which are adjacent in the first direction; and
   the second non-connecting regions are disposed between those first electrodes which are adjacent in the first direction,
   wherein the photovoltaic device further comprises at least one of a first structure in which the first electrode group includes at least one pair of electrodes adjacent in the second direction and directly connected to a single wire in the first wire group and a second structure in which the second electrode group includes at least one pair of electrodes adjacent in the second direction and directly connected to a single wire in the second wire group.

2. The photovoltaic device according to claim 1, further comprising at least one of a third structure in which the first electrode group includes at least one electrode connected to a plurality of wires in the first wire group and a fourth structure in which the second electrode group includes at least one electrode connected to a plurality of wires in the second wire group.

3. The photovoltaic device according to claim 1, wherein gaps between electrodes in the first electrode group are provided at different locations than are gaps between electrodes in the second electrode group.

4. The photovoltaic device according to claim 1, further comprising at least one of a third structure in which the at least one pair of adjacent electrodes in the first electrode group is connected to a single wire in the first wire group by conductive adhesive near ends thereof and a fourth structure in which the at least one pair of adjacent electrodes in the second electrode group is connected to a single wire in the second wire group by the conductive adhesive near ends thereof.

* * * * *